United States Patent
Nakashima et al.

(10) Patent No.: US 8,062,414 B2
(45) Date of Patent: Nov. 22, 2011

(54) COATING LIQUID FOR FORMING AMORPHOUS SILICA-BASED COATING FILM WITH LOW DIELECTRIC CONSTANT

(75) Inventors: Akira Nakashima, Fukuoka (JP); Miki Egami, Fukuoka (JP); Michio Komatsu, Fukuoka (JP); Yoshihiro Nakata, Kanagawa (JP); Ei Yano, Kanagawa (JP); Katsumi Suzuki, Toyota (JP)

(73) Assignees: JGC Catalysts and Chemicals Ltd., Kanagawa (JP); Fujitsu Limited, Kanagawa (JP)

( * ) Notice: Subject to any disclaimer, the term of this patent is extended or adjusted under 35 U.S.C. 154(b) by 1093 days.

(21) Appl. No.: 10/533,302

(22) PCT Filed: Oct. 27, 2003

(86) PCT No.: PCT/JP03/13690
§ 371 (c)(1),
(2), (4) Date: Jun. 16, 2005

(87) PCT Pub. No.: WO2004/039903
PCT Pub. Date: May 13, 2004

(65) Prior Publication Data
US 2006/0009575 A1    Jan. 12, 2006

(30) Foreign Application Priority Data
Oct. 31, 2002  (JP) ................................. 2002-318417

(51) Int. Cl.
*C04B 41/50* (2006.01)
*D06M 15/643* (2006.01)
*C09D 183/04* (2006.01)

(52) U.S. Cl. ............ 106/287.11; 106/287.1; 106/287.16

(58) Field of Classification Search .............. 106/287.1, 106/287.11, 287.16
See application file for complete search history.

(56) References Cited

U.S. PATENT DOCUMENTS

| 5,770,275 | A | * | 6/1998 | Raman et al. ................. 427/535 |
| 6,451,436 | B1 | * | 9/2002 | Komatsu et al. ............. 428/447 |
| 6,639,015 | B1 | | 10/2003 | Nakashima et al. |
| 2002/0060364 | A1 | | 5/2002 | Yan et al. |
| 2003/0041779 | A1 | * | 3/2003 | Burger et al. ............. 106/287.14 |
| 2003/0152510 | A1 | * | 8/2003 | Senderov et al. ............. 423/713 |
| 2004/0229747 | A1 | * | 11/2004 | Weisbeck et al. ............... 502/64 |

FOREIGN PATENT DOCUMENTS

| EP | 0 226 208 | 6/1987 |
| EP | 1 142 832 | 10/2001 |
| EP | 1 146 092 | 10/2001 |
| EP | 1 197 999 | 4/2002 |
| JP | 06173054 A | * 6/1994 |

OTHER PUBLICATIONS

Patent Abstract of Japan; Publication No. 2002-030249; Publication Date: Jan. 31, 2002; Applicant: Catalyst & Chem Ind Co Ltd.
Patent Abstract of Japan; Publication No. 2000-349083; Publication Date: Dec. 15, 2000; Applicant: Nippon ASM KK.
Patent Abstract of Japan; Publication No. 09-315812; Publication Date: Dec. 9, 1997; Applicant: Catalyst & Chem Ind Co Ltd.

* cited by examiner

*Primary Examiner* — James McDonough
(74) *Attorney, Agent, or Firm* — Leydig, Voit & Mayer, Ltd.

(57) ABSTRACT

The present invention relates to a coating liquid for forming an amorphous silica-based coating film with a low dielectric constant of 2.5 or below and the Young's modulus of 6.0 GPa or more and having excellent hydrophobic property, and to a method of preparing the same. The coating liquid may contain a silicon compound obtained by hydrolyzing tetraalkyl ortho silicate (TAOS) and specific alkoxysilane (AS) in the presence of tetraalkyl ammonium hydroxide (TAAOH), or may contain a silicon compound obtained by hydrolyzing or partially hydrolyzing tetraalkyl ortho silicate (TAOS) in the presence of tetraalkyl ammonium hydroxide (TAAOH), mixing the reaction product with specific alkoxysilane or a hydrolysate or a partial hydrolysate thereof, and hydrolyzing all or a portion of the mixture according to the necessity. In addition, the coating liquid is prepared by mixing components described above at a specific ratio and under specific process conditions.

18 Claims, 1 Drawing Sheet

COATING LIQUID FOR FORMING AMORPHOUS SILICA-BASED COATING FILM WITH LOW DIELECTRIC CONSTANT

RELATED APPLICATIONS

The present application is based on International Application No. PCT/JP03/13690 filed Oct. 27, 2003, and claims priority from, Japanese Application Number 2002-318417, filed Oct. 31, 2002, the disclosure of which is hereby incorporated by reference herein in its entirety.

FIELD OF THE INVENTION

The present invention relates to a coating liquid for forming on a substrate an amorphous silica-based coating film with the specific dielectric constant of 2.5 or below and also having a high film strength and excellent hydrophobic property with its surface being smooth or even, and further relates to a method of preparing the coating liquid.

BACKGROUND TECHNOLOGY

In association with the recent tendency for a higher degree of integration in semiconductor devices with the thickness of 0.25 micron rule or below and having multilayered wiring, as a space between the metal wires becomes narrower, impedance between the metal wires increases due to electrostatic induction, and therefore there is a strong concern about delay in a response speed or increase in power consumption. To overcome this problem, it is necessary to make as low as possible a dielectric constant of an inter-layer insulating film provided between a semiconductor substrate and a metal wiring layer such as an aluminum wiring layer or between metal wiring layers, and/or an inter-metal insulating film provided between metal wirings.

These insulating films provided for the purpose as described above are generally formed on a semiconductor substrate by the vapor-phase growth method such as the CVD method (Chemical Vapor Deposition Method) or the coating method such as the spin coat method.

In the case of the insulating film prepared by the latest technology in the CVD method (Refer to, for instance, the patent document 1), although an insulating film with the specific dielectric constant of 3 or below can be obtained, it is generally said that it is difficult to prepare an insulating film with the specific dielectric constant of around 2.5 or below, and like in the conventional coating method, there is also a defect that the film strength of the coating film becomes lower as the specific dielectric constant becomes lower. Further in a case of a CVD insulating film made from polyaryl resin, fluorine-added polyimide resin and fluorine resin, or in a case of an insulating film formed with the coating liquid, the specific dielectric constant can be lowered to around 2, but the adhesiveness to a surface of a substrate is not good, and further also the adhesiveness to the resist material used for fine mechanical processing and the like is low, and further the chemical resistance and the resistance against oxygen plasma are disadvantageously low.

Further with a coating film obtained by using a coating liquid for forming a silica-based coating film containing hydrolysates or partial hydrolysates of alkoxysilane and/or halogenated silane, although a coating film with the specific dielectric constant of 3 or below can be obtained, but it is difficult to achieve the specific dielectric constant of 2.5 or below, and the adhesiveness with a coated surface is rather low, which is disadvantageous.

The present inventors made strenuous efforts for solving the problems described above, and found out that, by using a) a coating liquid for forming a silica-based coating film with a low dielectric constant including a reaction product between alkoxysilane and/or halogenated silane or a hydrolysate thereof and silica fine particles (Refer to, for instance, patent document 2), b) a coating liquid for forming a silica-based coating film with a low dielectric constant including alkoxysilane and/or halogenated silane or a hydrolysate thereof and easily-decomposable resin which decomposes or vaporizes at a temperature of 500° C. or below (Refer to, for instance, patent document 3), c) a coating liquid for forming a silica-based coating film with a low dielectric constant including polysiloxane as a reaction product between alkoxysilane and/or halogenated silane or a hydrolysate thereof and silica fine particles and easily decomposable resin which decomposes or vaporizes at a temperature of 500° C. or below (Refer to, for instance, patent document 4), or d) coating liquid for forming a silica-based coating film with a low dielectric constant including alkoxysilane and/or halogenated silane or a hydrolysate thereof and an organic template material (Refer to, for instance, patent document 5), it is possible to form a coating film with the dielectric constant of 3 or below and excellent adhesiveness to a coated surface, high film strength, and chemical resistance such as alkaliproof characteristics, excellent cracking resistance and capable of ensuring smoothness of a coated surface, and further having high resistance against oxygen plasma and excellent process adaptability such as etching workability.

However, the present inventors repeatedly carried out experiments for forming a silica-based coating film with a low dielectric constant on various types of semiconductor substrates using a coating liquids and known methods for forming a coating film (spin coat method or other coating methods), and found out that, although a coating film having the characteristics as described above can be obtained, when it is tried to form a coating film with the specific dielectric constant of 2.5 or below, the film strength drops and a coating film having the Young's modulus of 6.0 GPa (giga pascal) or more strongly desired from the semiconductor industries can hardly be obtained in the stable state.

On the other hand, researchers of the US California University have proposed a method of forming a zeolite coating film (silica zeolite coating film having the MFI crystalline structure) on a semiconductor substrate using a suspension prepared by separating and removing particles having relative large diameters respectively from the zeolite fine particles obtained by hydrolyzing tetraethyl orthosilicate (TEOS) dissolved in ethyl alcohol in the presence of tetrapropyl ammonium hydroxide (TPAOH). The zeolite coating film obtained by this method has the Young' modulus of 16 to 18 GPa, but the moisture-absorption characteristics is high, so that the zeolite coating film absorbs moisture (water vapor) contained in the air and rapidly increases the specific dielectric constant thereof (for instance, from 2.3 to 3.9), and in that case the practicability of the zeolite coating film is disadvantageously lost. To overcome this problem, there have been proposed some methods including a method of keeping the specific dielectric constant of this coating film in the range from 2.1 to 2.3 by subjecting the zeolite coating film obtained as described above to sylilation to make the surface hydrophobic (Refer to, for instance, non-patent document 1, and patent document 6).

In order to carry out the sylilation (processing by the CVD method) as described above, however, in addition to the need of capital investment, complicated operations are required, so that the cost becomes substantially high. Further as the size of zeolite particles included in the coating film is large around 20 nm, a surface of the obtained zeolite coating film is substantially rough, and for instance, polishing is required for smoothing the surface. Further when the zeolite coating film is subjected to the processing for make it hydrophobic, only the surface is made hydrophobic, and therefore when a wiring pattern, a through hole or the like is formed by subjecting the coating film to fine mechanical processing such as resist application or etching, portions not having been converted to the hydrophobic state are exposed with moisture absorbed from the portions, and as a result the specific dielectric constant of the coating film is worsened (namely made higher), which is disadvantageous.

The present inventors made concentrated efforts for solving the problems as described above, and found out that the problems can be solved by forming a coating film on a substrate with a coating liquid for forming a coating film having the novel composition and characteristics as described hereinafter, and completed the present invention.

[Patent document 1] Japanese Patent Laid-Open Publication No. 2000-349083
[Patent document 2] Japanese Patent Laid-Open No. 1997-315812
[Patent document 3] International Application Publication WO 00/18847
[Patent document 4] International Application Publication WO 00/12640
[Patent document 5] Japanese Patent Laid-Open Publication No. 2002-30249
[Patent document 6] U.S. Patent Application Publication U.S. 2000/0060364 A1
[Non-patent document] Advanced Material 2001, 13, No. 19, October 2, Page 1453-1466

DISCLOSURE OF THE INVENTION

An object of the present invention is to provide, for solving the problems as described above, a coating liquid for forming an amorphous silica-based coating film with a low dielectric constant having the specific dielectric constant of 2.5 or below and the Young's modulus indicating the coating film strength of 6.0 GPa and capable of ensuring hydrophobic property and smoothness of a surface coated therewith, and also a method of preparing the coating liquid.

A first coating liquid for forming an amorphous silica-based coating film with a low dielectric constant according to the present invention is a coating liquid for forming an amorphous silica-based coating film with a low dielectric constant having a high film strength and excellent hydrophobic property and capable of ensuring smoothness of a surface coated therewith, and the coating liquid is characterized in that the coating liquid includes a silicon compound obtained by hydrolyzing tetraalkyl ortho silicate (TAOS) and alkoxysilane (AS) expressed by the following general formula (I) in the presence of tetraalkyl ammonium hydroxide (TAAOH):

$$X_n Si(OR)_{4-n} \tag{I}$$

wherein X indicates a hydrogen atom, a fluorine atom, or an alkyl group, a fluorine-substituted alkyl group, an aryl group or a vinyl group each having 1 to 8 carbon atoms; and R indicates a hydrogen atom, or an alkyl group, an aryl group or a vinyl group each having 1 to 8 carbon atoms; n is an integral number from 0 to 3.

A second coating liquid for forming an amorphous silica-based coating film with a low dielectric constant according to the present invention is a coating liquid for forming an amorphous silica-based coating film with a low dielectric constant having a high film strength and excellent hydrophobic property and capable of ensuring smoothness of a surface coated therewith, and the coating liquid is characterized in that the coating liquid includes a silicon compound obtained by hydrolyzing or partially hydrolyzing tetraalkyl ortho silicate (TAOS) in the presence of tetraalkyl ammonium hydroxide (TAAOH), mixing the reaction product with the alkoxysilane (AS) expressed by the general formula (I) described above or a hydrolysate or partial hydrolysate thereof, and hydrolyzing all or a portion of the mixture according to the necessity.

The tetraalkyl ortho silicate (TAOS) is preferably tetraethyl ortho silicate (TEOS), tetramethyl ortho silicate (TMOS) or a mixture thereof.

Further the alkoxysilane is preferably methyltrimethoxy silane (MTMS), methyltriethoxy silane (MTES) or a mixture thereof.

The tetraalkyl ammonium hydroxide (TAAOH) is preferably tetrapropyl ammonium hydroxide (TPAOH), tetrabutyl ammonium hydroxide (TBAOH) or a mixture thereof.

A content of impurities comprising compounds of alkali metal elements such as sodium (Na) and potassium (K) in the tetraalkyl ammonium hydroxide (TAAOH) is preferably 50 ppb by weight or below on respective element bases. A content of impurities comprising compounds of halogen group element such as bromine (Br) and chlorine (Cl) is preferably 1 ppm by weight or less on respective element bases.

In the coating liquid for forming a coating film according to the present invention, a molar ratio (TAOS/AS) of the tetraalkyl ortho silicate (TAOS) and the alkoxysilane (AS) is preferably in the range from 6/4 to 2/8 in terms of $SiO_2$.

Further a molar ratio (TAAOH/(TAOS+AS)) of the tetraalkyl ammonium hydroxide (TAAOH) and the components for forming the silica-based coating film (TAOS+AS) is preferably in the range from 1/10 to 7/10 in terms of $SiO_2$.

The coating liquid for forming a coating film according to the present invention preferably contains a silicon compound as hydrolysate of the tetraalkyl ortho silicate (TAOS) and alkoxysilane (AS) by 2 to 40 weight %.

A first method of preparing a coating liquid for forming a coating film according to the present invention is a method of preparing a coating liquid for forming an amorphous silica-based coating film with a low dielectric constant having a high film strength and excellent hydrophobic property and ensuring smoothness of a surface coated therewith, and comprising the steps of:

(i) mixing tetraalkyl ortho silicate (TAOS) and alkoxysilane (AS) expressed by the following general formula (I) with an organic solvent and agitating the mixture at a temperature in the range from 10 to 30° C. until the components are fully mixed with each other at a rotating speed of 100 to 200 rpm, (ii) adding an aqueous solution of tetraalkyl ammonium hydroxide (TAAOH) into the mixture solution under agitation over 5 to 20 minutes, and further agitating the mixture solution for 30 to 90 minutes at a temperature in the range from 10 to 30° C. at a rotating speed of 100 to 200 rpm, and then (iii) heating the mixture solution at a temperature in the range from 30 to 80° C. and further agitating the mixture solution for 1 to 72 hours at a rotating speed of 100 to 200 rpm keeping the temperature at the same level to prepare a liquid composition containing a silicon compound as a hydrolysate of the tetraalkyl ortho silicate (TAOS) and the alkoxysilane (AS):

$$X_n Si(OR)_{4-n} \tag{I}$$

wherein X indicates a hydrogen atom, a fluorine atom, or an alkyl group, a fluorine-substituted alkyl group, an aryl group or a vinyl group each having 1 to 8 carbon atoms; and R indicates a hydrogen atom, or an alkyl group, an aryl group or a vinyl group each having 1 to 8 carbon atoms; n is a integral number from 0 to 3.

In place of the adding method described above, the mixture solution comprising tetraalkyl ortho silicate (TAOS), alkoxysilane (AS) and an organic solvent prepared in step (i) may be slowly added over 30 to 90 minutes into the aqueous solution of the tetraalkyl ammonium hydroxide (TAAOH) in step (ii) under the same conditions as described above.

A second method of preparing a coating liquid for forming a coating film according to the present invention is a method of preparing a coating liquid for forming an amorphous silica-based coating film with a low dielectric constant having a high film strength and excellent hydrophobic property and capable of ensuring smoothness of a surface coated therewith, and comprising the steps of:

(i) mixing tetraalkyl ortho silicate (TAOS) with an organic solvent and agitating the mixture at a rotating speed of 100 to 200 rpm at a temperature in the range from 10 to 30° C. until the components are fully mixed with each other;
(ii) adding an aqueous solution of tetraalkyl ammonium hydroxide (TAAOH) into the mixture solution under agitation over 5 to 20 minutes, and further agitating the mixture solution for 30 to 90 minutes at a temperature in the range from 10 to 30° C. at a rotating speed of 100 to 200 rpm;
(iii) heating the mixture solution to a temperature in the range from 30 to 80° C. and agitating the mixture solution keeping the temperature for 0.5 to 72 hours at a rotating speed of 100 to 200 rpm to prepare a mixture solution containing a hydrolysate and/or partial hydrolysate of the tetraalkyl ortho silicate (TAOS);
(iv) further mixing alkoxysilane (AS) expressed by the general formula (I) above or a mixture thereof with an organic solvent in the mixture solution obtained in (iii) above, and agitating the resultant mixture solution at a temperature in the range from 10 to 30° C. until the components are fully mixed with each other at a rotating speed of 100 to 200 rpm;
(v) adding an aqueous solution of the tetraalkyl ammonium hydroxide (TAAOH) into the mixture solution under agitation over 5 to 20 minutes, and further agitating the resultant mixture solution for 30 to 90 minutes at a temperature from 10 to 30° C. and at a rotating speed of 100 to 200 rpm; and then
(vi) heating the mixture solution obtained in (v) above to a temperature in the range from 30 to 80° C. and agitating the mixture solution keeping the temperature for 10 to 30 hours at a rotating speed of 100 to 200 rpm;

to prepare a liquid composition containing a silicon compound which is a hydrolysate of the tetraalkyl ortho silicate (TAOS) and the alkoxysilane (AS).

In this step, in place of the adding method described above, the mixture solution comprising the tetraalkyl ortho silicate (TAOS) and the organic solvent prepared in (i) above may be added into the aqueous solution of tetraalkyl ammonium hydroxide (TAAOH) in (ii) above slowly over 30 to 90 minutes under the same conditions as described above.

A third method of preparing a coating liquid for forming a coating film according to the present invention is a method of preparing a coating liquid for forming an amorphous silica-based coating film with a low dielectric constant having a high film strength and excellent hydrophobic property and capable of ensuring smoothness of a surface coated therewith, and comprising the steps of:

(i) mixing tetraalkyl ortho silicate (TAOS) with an organic solvent and agitating the mixture at a rotating speed of 100 to 200 rpm at a temperature in the range from 10 to 30° C. until the components are fully mixed with each other;
(ii) adding an aqueous solution of tetraalkyl ammonium hydroxide (TAAOH) into the mixture solution under agitation over 5 to 20 minutes, and further agitating the mixture solution for 30 to 90 minutes at a temperature in the range from 10 to 30° C. at a rotating speed of 100 to 200 rpm;
(iii) heating the mixture solution to a temperature in the range from 30 to 80° C. and agitating the mixture solution keeping the temperature for 0.5 to 72 hours at a rotating speed of 100 to 200 rpm to prepare a mixture solution containing a hydrolysate and/or partial hydrolysate of the tetraalkyl ortho silicate (TAOS);
(iv) further mixing the alkoxysilane (AS) expressed by the general formula (I) above and an organic solvent in the mixture solution above, and agitating the resultant solution at a temperature in the range from 10 to 30° C. and at a rotating speed of 100 to 200 rpm until the components are fully mixed with each other;
(v) adding an aqueous solution of the tetraalkyl ammonium hydroxide (TAAOH) into the mixture solution above under agitation over 5 to 20 minutes, and then agitating the resultant mixture solution at a temperature from 10 to 30° C. for 30 to 90 minutes at a rotating speed of 100 to 200 rpm;
(vi) then heating the mixture solution to a temperature in the range from 30 to 80° C., and agitating the mixture solution keeping the temperature for 0.5 to 72 hours at a rotating speed of 100 to 200 rpm to prepare a mixture solution containing a hydrolysate and/or a partial hydrolysate of the alkoxysilane (AS);
(vii) mixing the mixture solution obtained in (iii) above and that obtained in (vi) and agitating the resultant mixture solution at a temperature in the range from 10 to 30° C. and at a rotating speed of 100 to 200 rpm until the components are fully mixed with each other; and
(viii) heating the solution obtained in (vii) above to a temperature from 30 to 80° C. according to the necessity and agitating the solution keeping the temperature for 10 to 30 hours at a rotating speed of 100 to 200 rpm to prepare a liquid composition containing a silicon compound of a hydrolysate of the tetraalkyl ortho silicate (TAOS) and alkoxysilane (AS).

In this case, in place of the adding method described above, a mixture solution comprising the tetraalkyl ortho silicate (TAOS) and an organic solvent prepared in (i) above may be slowly added into an aqueous solution of the tetraalkyl ammonium hydroxide (TAAOH) in (ii) above over 30 to 90 minutes under the same conditions described above, and also a mixture solution comprising the alkoxysilane (AS) and organic solvent prepared in (iv) may be slowly added over 30 to 90 minutes into an aqueous solution of the tetraalkyl ammonium hydroxide (TAAOH) in (v) under the same conditions as those described above.

In the method according to the present invention, it is preferable to use the tetraalkyl ortho silicate (TAOS), alkoxysilane (AS) and tetraalkyl ammonium hydroxide (TAAOH) each described above.

Further the tetraalkyl ortho silicate (TAOS) and alkoxysilane (AS) are preferably mixed with each other at a molar ratio (TAOS/AS) in the range from 6/4 to 2/8 in terms of $SiO_2$, and in addition it is preferable to add an aqueous solution of the tetraalkyl ammonium hydroxide (TAAOH) to components for forming a silica-based coating film (TAOS+AS) at a molar ratio (TAAOH/(TAOS+AS)) of 1/10 to 7/10 in terms of $SiO_2$.

The aqueous solution of tetraalkyl ammonium hydroxide (TAAOH) preferably contains the tetraalkyl ammonium hydroxide (TAAOH) by 5 to 40% by weight.

A content of impurities comprising compounds of alkali metal elements such as sodium (Na) and potassium (K) contained as impurities in the aqueous solution of tetraalkyl ammonium hydroxide (TAAOH) is preferably 50 ppb by weight or less on each element basis, and a content of impurities comprising compounds of halogen group elements such as bromine (Br) and chlorine (Cl) is preferably 1 ppm by weight or less on each element basis.

The aqueous solution of the tetraalkyl ammonium hydroxide (TAAOH) having the property as described above can be obtained by subjecting a commercially available aqueous solution of tetraalkyl ammonium hydroxide to a cation exchange resin treatment and also to an anion exchange resin treatment to substantially removing the impurities such as compounds of alkali metal elements such as sodium (Na) and potassium (K) as well as those of halogen group elements such as bromine (Br) and chlorine (Cl) contained therein for high-level purification.

The organic solvent is preferably alcohol such as ethanol.

Further the liquid composition obtained by the method described above is preferably subjected, prior to practical use thereof, to a process for solvent-substituting the organic solvent contained in the liquid composition with an organic solvent selected among propylene glycol monopropyl ether (PGP), propylene glycol monomethyl ether (PGME), propylene glycol monoethyl ether acetate (PGMEA) and the like with a rotary evaporator.

The liquid composition obtained as described above should preferably be adjusted so that a silicon compound as a hydrolysate of the tetraalkyl ortho silicate (TAOS) and alkoxysilane (AS) is contained in the liquid composition by 2 to 40% by weight.

BEST MODE FOR CARRYING OUT THE INVENTION

Figure 1:
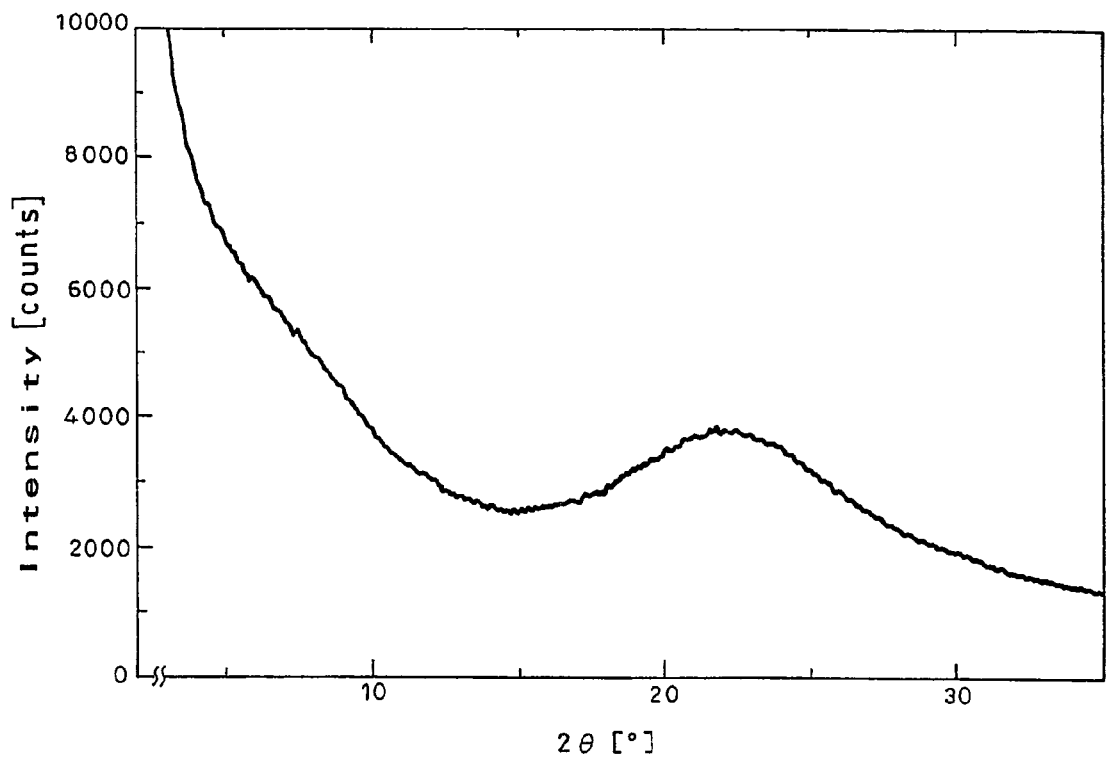
FIG. 1 shows a result of X-ray diffraction of a silica-based coating film (amorphous coating film) formed on Example substrate ①-2, while shows a result of the X-ray diffraction of a silica-based coating film (crystalline coating film) formed on Comparative Example substrate ③. The X-ray diffraction peaks in FIG. 2 (peaks at 2θ-8°, 9°, and 23°) indicate that the coating film has the MFI crystal structure (namely, the ZSM-5 type of zeolite coating film).

The coating liquid for forming an amorphous silica-based coating film with a low dielectric constant according to the present invention and a method of preparing the same are described below. Further a method of forming an amorphous silica-based coating film with a low dielectric constant on a substrate with the coating liquid according to the present invention is described below.
[Coating Liquid for Forming a Coating Film and a Method of Preparing the Same]
Coating Liquid A A first coating liquid (coating liquid A) for forming a coating film according to the present invention is a liquid composition containing a silicon compound obtained by hydrolyzing tetraalkyl ortho silicate (TAOS) and alkoxysilane (AS) expressed by the following general formula (I) in the presence of tetraalkyl ammonium hydroxide (TAAOH):

$$X_n Si(OR)_{4-n} \quad (I)$$

wherein X indicates a hydrogen atom, a fluorine atom, or an alkyl group, a fluorine-substituted alkyl group, an aryl group or a vinyl group each having 1 to 8 carbon atoms; and R indicates a hydrogen atom, or an alkyl group, an aryl group or a vinyl group each having 1 to 8 carbon atoms; n is an integral number from 0 to 3.

The tetraalkyl ortho silicate (TAOS) includes, but not limited to, tetramethyl ortho silicate, tetraethyl ortho silicate, tetrapropyl ortho silicate, tetraisopropyl ortho silicate, and tetrabutyl ortho silicate. It is preferable to use, of these compounds, tetraethyl ortho silicate (TEOS), tetramethyl ortho silicate (TMOS) or a mixture thereof.

The alkoxysilane (AS) includes, but not limited to, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, dimethyldimethoxysilane, diethyldiethoxysilane, dimethoxysilane, diethoxysilane, difluorodimethoxysilane, difluorodiethoxysilane, trifluoromethyltrimethoxysilane, and trifluoromethyltriethoxysilane. It is preferable to use, of these compounds, methytrimethoxysilane (MTMS), methyltriethoxysilane (MTES) or a mixture thereof.

The tetraalkyl ammonium hydroxide (TAAOH) includes, but not limited to, tetramethyl ammonium hydroxide, tetraethyl ammonium hydroxide, tetrapropyl ammonium hydroxide, tetrabutyl ammonium hydroxide, tetra-n-octyl ammonium hydroxide, n-hexadecyltrimethyl ammonium hydroxide, and n-octadecyltrimethyl ammonium hydroxide. It is preferable to use, of these compounds, tetrapropyl ammonium hydroxide (TPAOH), tetrabutyl ammonium hydroxide (TBAOH), or a mixture thereof.

It is generally known that compounds of alkali metal elements such as sodium (Na) and potassium (K) and the like and also compounds of halogen group elements such as bromine (Br) and chlorine (Cl) are included at a level from several hundreds ppm by weight to several weight % on respective element bases as impurities in the tetraalkyl ammonium hydroxide (TAAOH) sold on the market for general purposes.

However, when contents of the impurities comprising compounds of alkali metal elements such as sodium (Na) and potassium (K) are over 50 ppb by weight on respective element bases, the impurities are dispersed into a transistor portion constituting a semiconductor substrate, which may sometimes causes degradation of the transistor.

Further when contents of the impurities comprising compounds of halogen elements such as bromine (Br) or chlorine (Cl) are over 1 ppm by weight on respective element bases, an aluminum wire or a copper wire constituting the semiconductor are corroded, which may give fatal damages to the transistor.

Further the present inventors found out that, if impurities of the alkali metal compounds are included therein by 50 ppb by weight or more, when tetraalkyl orthosilicate (TAOS) and alkoxysilane (AS) expressed by the general formula (I) described above are hydrolyzed under the presence of tetraalkyl ammonium hydroxide (TAAOH), the impurities act as a catalyst, and as a result, the resultant silicon compound is a zeolite-like crystalline silica. As a result, it was also understood that the silica-based coating film becomes into the zeollitic and crystalline state, so that a surface of the silica-based coating film is not smooth but rough.

For the reasons as described above, when commercially-available tetraalkyl ammonium hydroxide (TAAOH) is to be used, it is necessary to previously remove the impurities contained therein to the level described above. Namely, when the tetraalkyl ammonium hydroxide (TAAOH) is to be used in the present invention, it is preferable to previously subject commercially-available tetraalkyl ammonium hydroxide to the treatment step with a cation exchange resin and then to the treatment step with an anion exchange resin to substantially remove the impurities comprising compounds of alkali metal elements such as sodium (Na) and potassium (K) and compounds of elements belong to the halogen group such as bromine (Br) or chlorine (Cl) for highly purifying the material.

In the coating liquid for forming a coating film according to the present invention, a molar ratio (TAOS/AS) of the tetraalkyl ammonium hydroxide (TAAOH) versus alkoxysilane should preferably be in the range from 6/4 to 2/8, and more preferably in the range from 5/5 to 3/7 in terms of $SiO_2$.

When the molar ratio (TAOS/AS) is over 6/4, the hydrophobic property of the obtained silica-based coating film becomes lower. When the molar ratio is under 2/8, the template effect provided by the tetraalkyl ammonium hydroxide (TAAOH) becomes lower, so that micropores (pore volumes) formed in the coating film are reduced, which makes it difficult to obtain a silica-based coating film having a specific dielectric constant of 2.5 or below.

Further a molar ratio (TAAOH/(TAOS+AS)) of the tetraalkyl ammonium hydroxide (TAAOH) versus components for forming a silica-based coating film (TAOS+AS) should preferably be in the range from 1/10 to 7/10, and more preferably in the range from 1/10 to 6/10 as converted to $SiO_2$.

When the molar ratio (TAAOH/(TAOS+AS)) is under 1/10, the function thereof as a template material is weak, so that micropores (pore volumes) formed in the coating film are reduced, which makes it difficult to obtain a silica-based coating film having a specific dielectric constant of 2.5 or below. When the molar ratio is over 7/10, the function thereof as a template material is strong, so that micropores (pore volumes) formed in the coating film increase, which makes it difficult to obtain a strong silica-based coating film having the Young's modulus of 6.0 GPa or more. Further, when a silica-based coating film is formed on a semiconductor substrate, a portion of the material may remain in the coating film, which may affect the functions for a semiconductor.

A method of preparing the coating liquid for forming a coating film according to the present invention (coating liquid A) is described below.

The coating liquid (coating liquid A) according to the present invention is prepared as a liquid composition containing a silicon compound or silicon compounds which are hydrolysates of the tetraalkyl ortho silicate (TAOS) and alkoxysilane (AS) by a method comprising the steps of:
(i) mixing tetraalkyl ortho silicate (TAOS) and alkoxysilane (AS) expressed by the general formula (I) described above with an organic solvent, and then agitating the resultant mixture until the components are fully mixed with each other at a temperature in the range from 10 to 30° C. at a rotating speed in the range from 100 to 200 rpm;
(ii) adding an aqueous solution of tetraalkyl ammonium hydroxide (TAAOH) into the mixture solution under agitation over 5 to 20 minutes, and further agitating the resultant solution for 30 to 90 minutes at a temperature in the range from 10 to 30° C. at a rotating speed in the range from 100 to 200 rpm; and then
(iii) heating the mixture solution at a temperature in the range from 30 to 80° C. and agitating the solution keeping the temperature for 1 to 72 hours at a rotating speed in the range from 100 to 200 rpm. In this case, the mixture solution comprising the tetraalkyl ortho silicate (TAOS), alkoxysilane (AS), and an organic solvent prepared in step (i) above may slowly be added into an aqueous solution of tetraalkyl ammonium hydroxide (TAAOH) in step (ii) over 30 to 90 minutes under the same conditions as those described above (at a temperature in the range from 10 to 30° C. and the agitating speed in the range from 100 to 200 rpm) instead of employing the adding method described above (namely the method in which the aqueous solution of TAAOH prepared in the step (ii) above is added into the mixture solution comprising TAOS, AS and an organic solvent prepared in the process step (i) above) (In other words, the methods may be categorized as a first method of preparing a coating liquid for forming a coating film according to the present invention).

In this step, the tetraalkyl ortho silicate (TAOS), alkoxysilane (AS), and tetraalkyl ammonium hydroxide (TAAOH) are mixed or added with the molar ratios as described above respectively in use.

The organic solvents allowable for use in the method according to the present invention include, but not limited to, alcohols, ketones, ethers, esters and hydrocarbons, and more specifically alcohols such as methanol, ethanol, propanol and butanol; ketones such as methylethyl ketone and methylisobutyl ketone; glycol ethers such as methyl cellosolve, ethyl cellosolve and propylene glycol monopropylether; glycols such as ethylene glycol, propylene glycol and hexylene glycol; esters such as methyl acetate, ethyl acetate, methyl lactate and ethyl lactate; hydrocarbons such as hexane, cyclohexane and octane; and aromatic hydrocarbons such as toluene, xylene and mesitylene. It is preferable to use, of these organic solvents, alcohols such as ethanol.

There is no specific restriction over a quantity of the organic solvent to be used, but the mixing ratio by weight (organic solvent/(TAOS+AS)) of the organic solvent against the components for forming a silica-based coating film (TAOS+AS) is preferably in the range from 1/1 to 3/1, and more preferably in the range from 1/1 to 2.5/1.

Further the aqueous solution of tetraalkyl ammonium hydroxide (TAAOH) added into the mixture solution preferably contains tetraalkyl ammonium hydroxide (TAAOH) by 5 to 40% by weight, and more preferably by 10 to 30% by weight in distilled water or ultra pure water. The water contained in this aqueous solution is, however, used for generating hydrolysis of tetraalkyl ortho silicate (TAOS) and alkoxysilane (AS), and a quantity of water contained in the aqueous solution must be sufficient for the hydrolysis reaction. Tetraalkyl ammonium hydroxide (TAAOH) acts as a catalyst for promoting the hydrolysis reaction, so that there is no need for other catalyst (such as, for instance, ammonia) to be added from the outside.

The conditions for the hydrolysis reaction include a temperature in the range from 30 to 80° C., more preferably in the range from 35 to 60° C., and the reaction should preferably be carried out under agitation over 1 to 72 hours, and more preferably over 10 to 48 hours.

A numerical average molecular weight of a silicon compound (hydrolysates of TAOS and AS) contained in the liquid composition obtained as described above is in the range from 500 to 1000000, and more preferably in the range from 1000 to 100000 in terms of polystyrene. When the numerical average molecular weight is in the range described above, it is possible to prepare a coating liquid for forming a coating film (namely the liquid composition described above) having the long time stability and adaptability to application.

Further polysiloxane (PS) which is a reaction product between one or more of silicon compounds selected from the group consisting of alkoxysilane expressed by the general formula (I) below, halogenated silane expressed by the general formula (II) below and/or hydrolysates thereof, and silica-based fine particles each having a diameter in the range from 5 to 50 nm may be added to the coating liquid for forming a coating film:

$$X_n Si(OR)_{4-n} \tag{I}$$

$$X_n SiX'_{4-n} \tag{II}$$

wherein X indicates any of a hydrogen atom, a fluorine atom, or an alkyl group, a fluorine-substituted alkyl group, an aryl group, or a vinyl group each having 1 to 8 carbon atoms; R indicates a hydrogen atom, or an alkyl group, an aryl group, and a vinyl group each having 1 to 8 carbon atoms; and X' indicates a halogen atom; n indicates an integral number in the range from 0 to 3.

The silica-based fine particles can be obtained by mixing one or more types of alkoxysilane expressed by the general formula (I) in an organic solvent and hydrolyzing or condensing/polymerizing the mixture solution under the presence of water and ammonia, and it is known that, when a silica-based coating film is formed on a substrate using a coating liquid containing polysiloxane (PS) obtained by reacting a hydrolysate or hydrolysates of alkoxysilane and/or halogenated silane to the surface thereof, the specific dielectric constant is 3.0 or below, a coating film having relatively excellent hydrophobic property can be obtained (For the details, refer to, for instance, Japanese Patent Laid-Open Publication No. 1997-315812).

A mixing ratio (PS/(TAOS+AS)) by weight of polysiloxane (PS) against the components for forming a silica-based coating film (TAOS+AS) should preferably be less than 1/3, and more preferably less than 1/4 in terms of $SiO_2$.

When the mixing ratio (PS/(TAOS+AS)) by weight is over 1/3, the strength of formed silica-based coating film becomes weaker, which makes it difficult to obtain a coating with the Young's modulus of 6.0 GPa or more. Further the dielectric constant becomes higher, and it is difficult to obtain a silica-based coating film with the dielectric constant of 2.5 or below. The reason is that, as a quantity of tetraalkyl ortho silicate (TAOS) becomes smaller, the template effect provided by tetraalkyl ammonium hydroxide (TAAOH) becomes smaller.

When the liquid composition containing the components for forming a silica-based coating film, namely a) silicon compounds which are hydrolysates of tetraalkyl ortho silicate (TAOS) and alkoxysilane (AS), or b) silicon compounds which are hydrolysates of tetraalkyl ortho silicate (TAOS) and alkoxysilane (AS) and polysiloxane (PS) obtained as described above, is used as a coating liquid for forming a coating film, the coating film should preferably contain the components for forming a silica-based coating film (silicon compounds, or silicon compounds and PS) by 2 to 40% by weight, and more preferably by 5 to 20% by weight in terms of $SiO_2$.

When the content is over 40% by weight, the long period stability of the coating liquid becomes worse. When the content is under 2% by weight, it becomes difficult to form a homogeneous coating film.

In the coating liquid A according to the present invention, the liquid composition containing components for forming a silica-based coating film obtained by the method described above may be used as it is as a coating liquid for forming a coating film, but it is preferable to subject the liquid composition, employing a rotary evaporator or the like, to a process for solvent-substituting the organic solvent component contained in the liquid composition with an organic solvent selected from the group consisting of propylene glycol monopropylether (PGP), propylene glycol monomethylether (PGME), and propylene glycol monoethylether acetate (PGMEA) and the like, and thereafter for adjusting the concentration of the components for forming a silica-based coating film to the level as described above. In this process for solvent substitution, the organic solvent, water, and further alcohols produced through hydrolysis of alkoxysilane (AS) are separated and removed, but the liquid composition obtained after the substitution process should still contain the organic solvent and water contained before the process in the range from 0.1 to 40% by weight, and more preferably in the range from 0.1 to 30 weight % against the total weight of the liquid contents respectively.

When the conditions are satisfied, it is possible to obtain a coating film for forming an amorphous silica-based coating film with a low dielectric constant and also having a high film strength and excellent hydrophobic property with its surface being smooth or even.

Coating Liquid B

A second coating liquid for forming a coating film (coating liquid B) according to the present invention contains a silicon compound obtained by hydrolyzing or partially hydrolyzing tetraalkyl ortho silicate (TAOS) under the presence of tetraalkyl ammonium hydroxide (TAAOH), then mixing the resultant product in alkoxysilane (AS) expressed by the general formula (I) below or a product obtained by hydrolyzing or partially hydrolyzing the material, and further hydrolyzing or partially hydrolyzing all or a portion of the mixture:

$$X_n Si(OR)_{4-n} \tag{I}$$

wherein X indicates any of a hydrogen atom, a fluorine atom, or an alkyl group, a fluorine-substituted alkyl group, an aryl group, or a vinyl group each having 1 to 8 carbon atoms; and R indicates a hydrogen atom, or an alkyl group, an aryl group, and a vinyl group each having 1 to 8 carbon atoms; n indicates an integral number in the range from 0 to 3.

The tetraalkyl ortho silicate (TAOS), alkoxysilane (AS), and tetraalkyl ammonium hydroxide (TAAOH) used in this step may be the same as those used for preparing the coating liquid A described above.

It is necessary to subject the tetraalkyl ammonium hydroxide (TAAOH) commercially available, like in preparation of the first coating liquid A, to the processing step with the cation exchange resin and also to the processing step with the anion exchange resin to substantially remove the impurities containing therein and comprising compounds of alkali metal elements such as sodium (Na) and potassium (K) and those of halogen group elements such as bromine (Br) and chlorine (Cl). Namely it is necessary to reduce a content of the impurities comprising compounds of alkali metal elements such as sodium (Na) and potassium (K) to 50 ppb by weight on each element basis, and also to reduce a content of halogen group elements such as bromine (Br) and chlorine (Cl) to 1 ppm by weight on each element basis.

The liquid composition (coating liquid B) is prepared by hydrolyzing or partially hydrolyzing tetraalkyl ortho silicate (TAOS), mixing alkoxysilane (AS) or a product obtained by hydrolyzing or partially hydrolyzing the alkoxysilane (AS) in the product obtained above, and further hydrolyzing or partially hydrolyzing all or a portion of the mixture according to the necessity.

When the alkoxysilane (AS) is previously hydrolyzed (or partially hydrolyzed) and then mixed therein, the operation should preferably be carried out under the presence of tetraalkyl ammonium hydroxide (TAAOH) like in the case of hydrolyzing (or partially hydrolyzing) tetraalkyl ortho silicate (TAOS).

In this case, the tetraalkyl ammonium hydroxide (TAAOH) should preferably be added, like in preparation of the coating liquid A, so that the molar ratio (TAAOH/TAOS and TAAOH/AS) against tetraalkyl ortho silicate (TAOS) and alkoxysilane (AS) is in the range from 1/10 to 7/10, more preferably in the range from 1/10 to 6/10 respectively. (Therefore, the molar ratio (TAAOH/(TAOS+AS)) of the tetraalkyl ammonium hydroxide (TAAOH) against the components for forming a silica-based coating film (TAOS+AS) is in the range from 1/10 to 7/10, and more preferably in the range from 1/10 to 6/10 in terms of $SiO_2$ like in the case of the coating liquid A).

Further when the components are mixed, like in preparation of the coating liquid A, the molar ratio (TAOS/AS) of the tetraalkyl ortho silicate (TAOS) versus the alkoxysilane (AS) should preferably be in the range from 6/4 to 2/8, and more preferably in the range from 5/5 to 3/7 in terms of $SiO_2$.

Next a method of preparing the coating liquid for forming a coating film (coating liquid B) according to the present invention is described below.

The coating liquid for forming a coating film (coating liquid B) according to the present invention is a liquid composition containing a silicon compound which is a hydrolysate of the tetraalkyl ortho silicate (TAOS) and alkoxysilane (AS) prepared by a method comprising the steps of:
(i) mixing tetraalkyl ortho silicate (TAOS) with an organic solvent, and agitating the mixture at a temperature from 10 to 30° C. and at a rotating speed of 100 to 200 rpm until the components are fully mixed with each other;
(ii) adding an aqueous solution of tetraalkyl ammonium hydroxide (TAAOH) into the mixture solution being agitated over 5 to 20 minutes, and further agitating the resultant mixture for 30 to 90 minutes at a temperature from 10 to 30° C. and at a rotating speed of 100 to 200 rpm;
(iii) heating the mixture to a temperature from 30 to 80° C., agitating the mixture keeping the temperature for 0.5 to 72 hours at a rotating speed of 100 to 200 rpm to prepare a mixture solution containing a product obtained by hydrolyzing and/or partially hydrolyzing the tetraalkyl ortho silicate (TAOS);
(iv) further mixing the alkoxysilane (AS) expressed by the general formula (I) or a mixture thereof with an organic solvent in the mixture solution obtained in the step (iii) above, and agitating the resultant mixture at a temperature from 10 to 30° C. and at a rotating speed of 100 to 200 rpm until the components are fully mixed with each other;
(v) adding an aqueous solution of tetraalkyl ammonium hydroxide (TAAOH) into the mixture solution above being agitated over 5 to 20 minutes and further agitating the resultant mixture solution for 30 to 90 minutes at a temperature from 10 to 30° C. and at a rotating speed of 100 to 200 rpm; and
(vi) heating the mixture solution obtained in the step (v) above to a temperature in the range from 30 to 80° C. and agitating the solution keeping the temperature level for 10 to 30 hours at a rotating speed of 100 to 200 rpm. In this case, in place of the adding method described above (namely the method of adding an aqueous solution of TAAOH obtained in the step (ii) into a mixture solution of TAOS and an organic solution prepared in the step (i)), the mixture solution comprising tetraalkyl ortho silicate (TAOS) and an organic solvent prepared in the step (i) may slowly be added into the aqueous solution of the tetraalkyl ammonium hydroxide (TAAOH) in the step (ii) over 30 to 90 minutes under the same conditions described above (at a temperature from 10 to 30° C. and at a rotating speed from 100 to 200 rpm). (Namely either one of the methods may be employed as a second method for preparing the coating liquid for forming a coating film according to the present invention.)

Further the coating liquid for forming a coating film (coating liquid B) according to the present invention is a liquid composition including a silicon compound which is hydrolysates of tetraalkyl ortho silicate (TAOS) and alkoxysilane (AS), and is prepared by a method comprising the steps of:
(i) mixing tetraalkyl ortho silicate (TAOS) in an organic solvent, and agitating the mixture solution at a temperature of 10 to 30° C. and at a rotating speed of 100 to 200 rpm until the components are mixed with each other;
(ii) adding an aqueous solution of tetraalkyl ammonium hydroxide (TAAOH) into the mixture solution being agitated, and, further agitating the resultant solution for 30 to 90 minutes at a temperature of 10 to 30° C. and at a rotating speed of 100 to 200 rpm;
(iii) heating the resultant solution to a temperature of 30 to 80° C., agitating the mixture solution keeping the temperature for 0.5 to 72 hours at a rotating speed of 100 to 200 rpm to prepare a mixture solution containing a hydrolysate and/or partial hydrolysate of the tetraalkyl ortho silicate (TAOS);
(iv) further mixing the alkoxysilane (AS) expressed by the general formula (I) in an organic solvent, and agitating the mixture solution at a temperature from 10 to 30° C. and at a rotating speed of 100 to 200 rpm until the components are fully mixed with each other;
(v) then adding tetraalkyl ammonium hydroxide (TAAOH) into the mixture solution being agitated over 5 to 20 minutes, and agitating the resultant mixture solution for 30 to 90 minutes at a temperature from 10 to 30° C. and at a rotating speed of 100 to 200 rpm;
(vi) heating the mixture solution to a temperature of 30 to 80° C., mixing the mixture solution keeping the temperature for 0.5 to 72 hours at a speed of 100 to 200 rpm to prepare a mixture solution containing a hydrolysate and/or a partial hydrolysate of the alkoxysilane (AS);
(vii) then mixing the mixture solution prepared in the step (iii) above with the mixture solution obtained in the step (vi), and agitating the resultant mixture solution at a temperature from 10 to 30° C. and a rotating speed of 100 to 200 rpm until the components are fully mixed with each other; and
(viii) further heating the solution obtained in the step (vii) above to a temperature to 30 to 80° C. according to the necessity, and then agitating the mixture solution keeping the temperature for 10 to 30 hours at a rotating speed of 100 to 200 rpm.

In this case, in place of the adding method described above (namely the method of adding the aqueous solution of TAAOH obtained in the step (ii) into the mixture solution comprising TAOS and an organic solvent prepared in the step (i) above, and also adding the aqueous solution of the TAAOH obtained in the step (v) into the mixture solution comprising the AS and an organic solvent prepared in the step (v)), it is possible to employ a method comprising the steps of gradually adding the mixture solution comprising tetraalkyl ortho silicate (TAOS) and an organic solvent prepared in the step (i) above into the aqueous solution of tetraalkyl ammonium hydroxide (TAAOH) prepared in the step (ii) over 30 to 90 minutes under the same conditions as those described above (at a temperature of 10 to 30° C. and at a rotating speed of 100 to 200 rpm), and further adding the mixture solution comprising alkoxysilane (AS) and an organic solvent prepared in the step (iv) into the aqueous solution of tetraalkyl ammonium hydroxide (TAAOH) prepared in the step (v) above over 30 to 90 minutes under the same conditions as those described above (at a temperature of 10 to 30° C. and at a rotating speed of 100 to 200 rpm). (Namely, each of these methods is a third method of preparing a coating liquid for forming a coating film according to the present invention).

In this step, the tetraalkyl ortho silicate (TAOS), alkoxysilane (AS) and tetraalkyl ammonium hydroxide (TAAOH) are mixed with each other or added to satisfy the molar ratios described above respectively.

As the organic solvent, the same one as that as an example available for preparation of the coating liquid A may be used. The organic solvents mixed in tetraalkyl ortho silicate (TAOS) and in alkoxysilane (AS) may be different on the condition that the two organic solvents belong to the same type (such as, for instance, alcohols), but are preferably the same ones.

There is no specific restriction over a quantity of the organic solvent to be used, but the mixing ratio thereof (organic solvent/(TAOS+AS)) against the components for forming a silica-based coating film (TAOS and AS) should preferably be in the range from 1/1 to 3/1, and more preferably in the range from 1/1 to 2.5/1. Therefore, the mixing ratio by weight (organic solvent/(TAOS+AS)) of the organic solvent with the components mixed therein versus the components for forming a silica-based coating film (TAOS+AS) should preferably be in the range from 1/1 to 3/1, and more preferably in the range from 1/1 to 2.5/1 like in the case of coating liquid A.

Further the aqueous solution of tetraalkyl ammonium hydroxide (TAAOH) to be added into the mixture organic solvent should preferably contain tetraalkyl ammonium hydroxide (TAAOH) by 5 to 40% by weight, and more preferably by 10 to 30% by weight in distilled water or ultra pure water like in the case of the coating liquid A.

The hydrolysis described above should preferably be performed, like in the case of the coating liquid A, by agitation for 0.5 to 72 hours and more preferably for 10 to 48 hours at a temperature of 30 to 80° C., and more preferably at a temperature of 35 to 60° C. In the second preparation method and third preparation method described above, a period of time spent for hydrolyzing only the tetraalkyl ortho silicate (TAOS) or alkoxysilane (AS) may be short, but a period of time required to completely hydrolyze the components (such as 10 to 30 hours) should preferably be spent for this reaction in the next step.

A numeric average molecular weight of silicon compounds (hydrolysates of TAOS and AS) contained in the liquid composition obtained as described above are, like in the case of the coating liquid A, in the range from 500 to 1000000, and more preferably in the range from 1000 to 100000 in terms of polystyrene.

Further polysiloxane (PS) which is a reaction product between one or more silicon compounds selected from the group consisting of the alkoxysilane expressed by the general formula (I) and halogenated silane expressed by the general formula (II) below and/or hydrolysates thereof, and silica-based fine particles each having particle size from 5 to 50 nm may be contained in the coating liquid for forming a coating film according to the necessity like in the case of the coating liquid A:

$$X_n Si(OR)_{4-n} \quad (I)$$

$$X_n SiX'_{4-n} \quad (II)$$

wherein X indicates any of a hydrogen atom, a fluorine atom, or an alkyl group, a fluorine-substituted alkyl group, an aryl group, or a vinyl group each having 1 to 8 carbon atoms; R indicates a hydrogen atom, or an alkyl group, an aryl group, and a vinyl group each having 1 to 8 carbon atoms; and X' indicates a halogen atom; n indicates an integral number in the range from 0 to 3.

However, a content of the polysiloxane (PS) as expressed by a weight mixing ratio (PS/(TAOS+AS)) against the components for forming a silica-based coating film (TAOS+AS) should preferably be less than 1/3, and more preferably less than 1/4 in terms of $SiO_2$.

When the liquid composition containing the components for forming a silica-based coating film, namely a) silicon compounds which are hydrolysates of tetraalkyl ortho silicate (TAOS) and alkoxysilane (AS), or b) silicon compounds which are hydrolysates of tetraalkyl ortho silicate (TAOS) and alkoxysilane (AS) and polysiloxane (PS), is used as a coating liquid for forming a coating film, like in the case of the coating liquid A, the coating liquid should preferably contain the components for forming a silica-based coating film (silicon compounds, or silicon compounds and PS) by 2 to 40% by weight, and more preferably by 5 to 20% by weight in terms of $SiO_2$.

In the coating liquid B according to the present invention, like in the case of the coating liquid A, the liquid composition containing the components for forming a silica-based coating film obtained by the method described above may be used as a coating liquid for forming a coating film as it is, but it is preferable to subject the coating liquid to the process for solvent-substituting the organic solvent component contained in the liquid composition with an organic solvent selected from the group consisting of propylene glycol monopropylether (PGP), propylene glycol monomethyl ether (PGME), propylene glycol monoethyl ether acetate (PGMEA) and the like with a rotary evaporator, and then to adjust concentrations of the components for forming a silica-based coating film to the level as described above respectively for use. In this process for solvent substitution, the organic solvent, water, and further alcohols produced through hydrolysis of alkoxysilane (AS) contained in the liquid composition are separated and removed, but the liquid composition obtained after the substitution process should still contain the organic solvent and water contained before the process preferably in the range from 0.1 to 40% by weight, and more preferably in the range from 0.1 to 30 weight % against the total weight of the liquid contents respectively.

When the conditions are satisfied, it is possible to obtain a coating film for forming an amorphous silica-based coating film with a low dielectric constant and also having a high film strength and excellent hydrophobic property with its surface being smooth or even.

[Method of Forming an Amorphous Silica-Based Coating Film with a Low Dielectric Constant]

For forming an amorphous silica-based coating film with a low dielectric constant on a substrate using the coating liquid for forming a coating film according to the present invention, it is necessary to carry out the applying step, heating step, and curing step as described below.

(a) Applying Step

Generally, such methods as the spin coat method, dip coat method, roll coat method, and transcription method are employed for applying the coating liquid as described above, and also in the present invention, an amorphous silica-based coating film having a low dielectric constant can be formed using any of the methods based on the conventional technology as described above. Of these methods, when a coating liquid for forming a coating film is applied, for instance, on a semiconductor substrate, the spin coat method is most preferable because of the homogeneity in its film thickness, low dust generating property, and the like. Therefore, in the present invention, the coating method based on the spin coat method is preferably employed, but when the coating liquid for forming a coating film is applied, for instance, on a semiconductor substrate with a larger diameter, the transcription method or the like may be employed.

(b) Heating Step

The coating film applied on a substrate is heated at a temperature of 80 to 350° C.

When the heating step is carried out at a temperature over 350° C., an organic solvent contained in the applied coating film rapidly evaporates, and pores or voids each having a relatively large diameter are formed in the coating film, so that the strength of the coating film may largely drop. For the reason as described above, the heating step is preferably carried out by raising the temperature step by step according to the necessity in the range from 80 to 350° C. Further when this heating step is carried out at a temperature lower than 80° C., the organic solvent contained in the coating film little evaporates, and remains in the coating film, which spoils the purpose of heating step, and also the thickness of a formed coating film becomes inhomogeneous.

Although a required period of time for this heating step varies according to such factors as a required film thickness, generally the heating step is preferably carried out for 1 to 10 minutes, and preferably for 2 to 5 minutes.

Further the heating step may be carried out in a nitrogen gas atmosphere as an inert gas or in the air. However, in the present invention, the heating step is preferably carried out in the air. As this heating step is carried out for a short period of time at a temperature of 350° C. or below which is relatively low, even if this heating step is carried out in the air containing oxygen of about 21% by volume, damages such as oxidization of metals are not given to the metal wiring provided on the semiconductor substrate. Further as a small quantity of oxygen may be fetched into the coating film, a silica-based coating film with a higher degree of —Si—O—Si— bridging is generated during the curing step (c) described hereinafter, which makes higher the possibility of formation of a silica-based coating film with excellent moisture-absorption characteristics and high strength and also having a low dielectric constant.

When the heating step as described above is carried out, the organic solvent contained in the applied coating liquid evaporates, and also the tetraalkyl ammonium hydroxide (TAAOH) contained in the coating film is decomposed or separated, which promotes polymerization and curing of the components for forming a silica-based coating film which are solid components, and also the molten viscosity of a polymer becomes lower during the heating step, so that the reflowing property of the coating film increases, and therefore the smoothness of an obtained coating film is improved.

The heating step should preferably be carried out by placing the substrate obtained in the applying step described above on a hot plate of a single wafer system.

(c) Curing Step

Next, the coating film having been subjected to the heating step is cured at a temperature from 350 to 450° C. in the atmosphere of inert gas.

It is preferable to use a nitrogen gas as the inert gas, and further, if required, an inert gas containing a small volume of oxygen (for instance by about 500 to about 10000 volume ppm) produced by adding an oxygen gas or air to the inert gas above may be used for the same purpose (as described, for instance, in International Patent Application Publication No. WO 01/48806 A1).

As for the curing step, a temperature in the range from 350 to 450° C. is preferably employed for obtaining an amorphous silica-based coating film with excellent moisture absorption characteristics (hydrophobic property) and high strength and having a low dielectric constant, although the required temperature may change according to a type and a quantity of tetraalkyl ammonium hydroxide (TAAOH) used for preparation of the coating liquid for forming a coating film, or to characteristics of silicon compounds (namely components for forming a silica-based coating film) contained in the coating liquid.

When the curing temperature is under 350° C., bridging hardly occurs in precursors of components for forming a silica-based coating film, so that a coating film having sufficient strength can hardly be obtained, and when the curing temperature is over 450° C., aluminum wiring or copper wiring arranged on a semiconductor substrate may be oxidized or melted, which may give fatal damages to the wiring layer.

The curing step is preferably carried out over 5 to 90 minutes, and more preferably over 10 to 60 minutes, although the required period of time varies according to a type of the coating liquid for forming a coating film or a thickness of a coating film to be formed.

Further the heating step should preferably be carried out by placing the substrate obtained in the applying step described above on a hot plate of a single wafer system.

The thickness of a silica-based coating film obtained as described above is generally in the range from 100 to 600 nm, for instance, on a silicon substrate (silicon wafer) in a semiconductor device, although the required thickness varies according to a semiconductor substrate on which a coating film is to be formed or the purpose, but is generally in the range from 100 to 1000 nm between wiring layers in a multilayered wiring layer.

[Amorphous Silica-Based Coating Film with a Low Dielectric Constant]

A coating film formed by using the coating liquid according to the present invention has a specific dielectric constant of 2.5 or below and Young's modulus of 6.0 GPa or more.

Further with the coating liquid according to the present invention, a silica-based coating film with pores having the average diameter of 3 nm or below and also with a content of micropores each with the diameter of 2 nm or below of 70% or more can easily be formed. The physical properties described above are important for forming the coating film having high strength and a low dielectric constant.

For the reasons as described above, with the present invention, it is possible to form a silica-based coating film satisfying the requirements from the semiconductor manufacturers in recent years.

Further with the coating liquid according to the present invention, it is possible to easily form a silica-based coating film having the surface roughness (Rms) of 1 nm or below and also having a smooth surface. This surface roughness is defined as a square average roughness of values measured with an atomic force microscope (AFM). With the characteristics, it is not always required to perform the complicated polishing process for flattening a surface of a coating film formed on a substrate, so that it is possible to overcome the defects of the zeolitic coating film as described above.

In addition, the silica-based coating film formed with the coating liquid according to the present invention has the excellent hydrophobic property (moisture absorption resisting characteristics), and therefore even if the coating film is left in the air atmosphere containing saturated water vapor, worsening the specific dielectric constant (namely increase in the specific dielectric constant) like that in the zeolitic film never occurs. Further there is no need for subjecting a surface of the coating film to silylation as required for a zeolitic film.

The silica-based coating film obtained by using the coating liquid according to the present invention is an amorphous silica-based coating film not having an X-ray diffraction peak such as that observed in the MFI crystal structure of a zeolitic coating film.

Further, the coating liquid according to the present invention is used for forming a coating film on a semiconductor substrate, between wiring layers in a multilayered wiring layer, on a substrate with an element surface and/or a PN junction section provided thereon, or between multilayered wiring layers provided on each of the substrates as described above. Of these, the coating liquid according to the present invention is advantageously used for forming an inter-layer insulation film on a semiconductor substrate and the like.

With the coating liquid according to the present invention, an amorphous silica-based coating film having a low dielectric constant of 2.5 or less as well as having the high strength expressed by the Young's modulus of 6.0 GPa or more and excellent moisture absorption resisting characteristics (hydrophobic property) can easily be formed on a substrate without subjecting a surface of the coating film to silylation or the like.

Further with the coating liquid according to the present invention, an amorphous silica-based coating film with a low dielectric constant and also having a smooth surface with the surface roughness (Rms) of 1 nm or below can be formed on a substrate without subjecting a surface of the coating film to the polishing process or the like.

Further, the silica-based coating film obtained by using the coating liquid according to the present invention has, in addition to the properties as described above, the excellent adhesiveness to a surface for forming a coating film thereon such as a semiconductor substrate, chemical resistance such as alkaliproof, and cracking resistance, and furthermore has excellent process adaptability such as oxygen plasma resistance or workability by etching.

Namely, in the silica-based coating film formed with the coating liquid according to the present invention, in addition to the effects and advantages achieved by the inventions applied for patents in the past by the present inventors, there are provided such effects and advantages as the low specific dielectric constant of 2.5 or below, high film strength expressed by the Young's modulus of 6.0 GPa or more, and excellent moisture absorption resisting characteristics (hydrophobic property).

Examples of the present invention are described in detail below, but the present invention are not limited to the examples.

Example 1

300 g cation exchange resin powder (WK-40, produced by Mitsubishi Chemicals Co.) was added to 1 kg aqueous solution containing 40% by weight of tetrapropyl ammonium hydroxide (TPAOH, produced by Lion Corp.), and the resultant mixture solution was agitated for one hour at the room temperature and at a rotating speed of 100 rpm, and then the added cation exchange resin powder was removed by filtration. Then 2100 g anion exchange resin powder (SAT-10, produced by Mitsubishi Chemicals Co.) was added, and the resultant mixture was agitated for one hour at a rotating speed of 100 rpm, and the added anion exchange resin powder was removed by filtration.

Ultra pure water was added to the obtained aqueous solution of tetrapropyl ammonium hydroxide (TPAOH) to adjust the concentration to 10% by weight, and quantities of compounds of alkali metal elements such as sodium (Na) and potassium (K) and also compounds of halogen group elements such as bromine (Br) and chlorine (Cl) contained as impurities in the aqueous solution were measured by the atomic absorption spectrometry method (AAS method, with a polarized Zeeman atomic absorption photometer Z-5710 produced by Hitachi Inc.) and ion chromatography method (with 2020i produced by DIONEX) respectively.

Further ultra pure water was added to an aqueous solution of the tetrapropyl ammonium hydroxide (commercially procurable) not having been subjected to the ion exchange processes described above to adjust the concentration to 10% by weight, and contents of impurities contained therein were measured as described above.

As a result, contents of the impurities contained in the aqueous solution not having been subjected to the ion exchange processes were 50 ppm by weight for sodium, 2500 ppm by weight for potassium, 2250 ppm by weight for bromine, and 13 ppm by weight for chlorine as converted to each element respectively, but those of the impurities contained in the aqueous solution having been subjected to the ion exchange processes were 10 ppb by weight or below for sodium (lower limit for detection), 10 ppb by weight or below for potassium (lower limit for detection), 1 ppm by weight or below for bromine, and 1 ppm by weight or below for chlorine as converted to each element respectively. Namely the aqueous solution of tetrapropyl ammonium hydroxide (commercially available product) could be highly purified to the minimum content level of impurities allowable in the present invention.

Then, tetraethyl ortho silicate (TEOS, produced by Tama Chemical Industry Corp.), methyltrimethoxy silane (MTMS, produced by Shin'etsu Kagaku K.K), and ethanol with the concentration of 99.5% by weight (ETOH, produced by Wako Jun'yaku K. K) were mixed at mixing ratios as shown in Table 1, and the mixture solution was kept at a temperature of 20° C. and agitated for 30 minutes at a rotating speed of 150 rpm.

The highly purified aqueous solution of tetrapropyl ammonium hydroxide (containing TPAOH by 10% by weight) was added over 10 minutes into the mixture solution at the mixing ratio as shown in Table 1, and the resultant mixture solution was kept at a temperature of 20° C. and agitated for 1 hour at a rotating speed of 200 rpm. Then the mixture solution was heated to a temperature of 50° C. and agitated keeping the temperature at the level above for 20 hours at a rotating speed of 200 rpm to hydrolyze the components for forming a silica-based coating film (TEOS and MTMS).

Then mixture solution containing hydrolysates of the components for forming a silica-based coating film was subjected to the solvent substitution process for substituting ethanol (organic solvent) contained therein with propylene glycol monopropyl ether (PGP, produced by Nihon Emulsion Co.) using a rotary evaporator (R-114 produced by Shibata Kagaku Co.), and then concentrations of silicon compounds comprising hydrolysates of tetraethyl ortho silicate (TEOS) and methyltrimethoxy silane (MTMS) were adjusted to obtain liquid compositions each containing the compounds by 12% by weight in terms of $SiO_2$ (Examples of coating liquid ①-1 to ①-8). The requirements for preparation of the liquid compositions (coating liquid for forming a coating film) are as shown in Table 1.

5 ml of the coating liquid for forming a coating film obtained as described above was dripped on silicon wafer substrates (semiconductor substrates) each with the size of 8×8 square inches using the spin coat method known in the conventional technology (ACT-8 produced by Tokyo Electron Co.) and was applied thereon for 20 seconds at a rotating speed of 2000 rpm.

Then the substrates were placed on a hot plate of a single wafer system and were heated for 3 minutes at a temperature of 150° C. in the nitrogen atmosphere. Some components of the coating film such as the organic solvent (PGP) evaporated during the heating step, and the evaporated components were eliminated to the outside.

Further in the state where the substrates were placed on the hot plate of a single wafer system, the substrates were cured for 30 minutes at a temperature of 400° C. in the nitrogen atmosphere. Then the substrates (Example substrates ①-1 to ①-8) were cooled down to around the room temperature, and taken out from the system.

The film thickness of the silica-based coating film formed on each of the substrate obtained as described above (measured with a spectro-ellipsometer ESVG produced by SOPRA) was about 500 nm.

The silica-based coating film formed on the substrate was measured for the following matters: (i) specific dielectric constant (with the mercury probe method with the frequency of 1 MHz, SSM 495 produced by Solid State Measurements), (ii) change rate in moisture absorption by the coating film before and after irradiation of an oxygen plasma (with the TDS method, Thermal Desorption Mass-Spectroscopy, EDM-1000 produced by Denshi Kagaku Co.), (iii) film strength (Young's modulus, nano-indentation method, Nano-indenter XP produced by MTS Systems Corp.), (iv) surface roughness (Rms, AFM method), (v) pore distribution (average diameter of pores and volume percentage of micropores each with the diameter of 2 nm or below against the total volume: nitrogen absorption method), and (vi) X-ray diffraction peak (determined for an crystalline coating film or an amorphous coating film: X-ray diffraction method). The processors and measuring devices or apparatuses used in Example 1 were also used in Examples 2 to 8 and Comparative Examples 1 to 5 described hereinafter.

The result of the measurement is shown in Table 5. Further, the result of X-ray diffraction of the silica-based coating film formed on Example substrate ①-2 is shown in FIG. 1.

Example 2

60.8 g tetramethyl ortho silicate (TMOS, produced by Tama Chemical Industry Corp.), 127.3 g methyl trimethoxy silane (MTMS, produced by Shin' etsu Kagaku Kogyo Corp.) and 513.6 g ethanol with the concentration of 99.5% by weight (ETOH, produced by Wako Jun'yaku Corp.) were mixed with each other, and this mixture solution was kept at a temperature of 20° C. and agitated for 30 minutes at a rotating speed of 150 rpm.

293.3 g of highly purified aqueous solution of the tetrapropyl ammonium hydroxide (containing TPAOH by 10% by weight) was added into the mixture solution over 10 minutes, and the resultant mixture solution was agitated for 1 hour at a temperature of 20° C. and at a rotating speed of 150 rpm. Then the resultant solution was heated to 50° C., and was agitated for 20 hours at the same temperature and at a rotating speed of 200 rpm to hydrolyze the components for forming a silica-based coating film (TMOS and MTMS).

Further, like in Example 1, the mixture solution was subjected to the solvent substitution process to substitute ethanol (organic solvent) in the mixture solution containing hydrolysates of the components for forming a silica-based coating film with propylene glycol monopropyl ether (PGP) using a rotary evaporator, and then concentrations of silicon compounds comprising hydrolysates of tetramethyl ortho silicate (TMOS) and methyl trimethoxy silane (MTMS) were adjusted to obtain liquid compounds each containing the compounds by 12% by weight in terms of $SiO_2$ respectively (Example of coating liquids ②). The requirements for preparation of the liquid composition (coating liquid for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ②) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 3

85.7 g tetraethyl ortho silicate (TEOS, produced by Tama Chemical Industry Corp.), 166.2 g methyl trimethoxy silane (MTMS, produced by Shin'etsu Kagaku Kogyo Corp.) and 449.8 g ethanol with the concentration of 99.5% by weight (ETOH, produced by Wako Jun'yaku Corp.) were mixed with each other, and this mixture solution was kept at a temperature of 20° C. and agitated for 30 minutes at a rotating speed of 150 rpm.

298.3 g of highly purified aqueous solution of the tetrapropyl ammonium hydroxide (containing TPAOH by 10% by weight) was added into the mixture solution over 10 minutes, and the resultant mixture solution was agitated for 1 hour at a temperature of 20° C. and at a rotating speed of 150 rpm. Then the resultant solution was heated to 50° C., and was agitated for 20 hours at the same temperature and at a rotating speed of 200 rpm to hydrolyze the components for forming a silica-based coating film (TEOS and MTES).

Then, like in Example 1, the mixture solution was subjected to the solvent substitution process to substitute ethanol (organic solvent) in the mixture solution containing hydrolysates of the components for forming a silica-based coating film with propylene glycol monopropyl ether (PGP) using a rotary evaporator, and then concentrations of silicon compounds comprising hydrolysates of tetraethyl ortho silicate (TEOS) and methyl trimethoxy silane (MTMS) were adjusted to obtain liquid compounds each containing the compounds by 12% by weight in terms of $SiO_2$ respectively (Example of coating liquids ③). The requirements for preparation of the liquid composition (coating liquid for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ③) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 4

300 g cation exchange resin powder (WK-40, produced by Mitsubishi Chemical Industry Corp.) was added to 1 kg aqueous solution containing tetrabutyl ammonium hydroxide (TBAOH, produced by Lion Corp.) by 40% by weight, and the resultant mixture solution was agitated for one hour at the room temperature and at a rotating speed of 200 rpm, and then the added cation exchange resin powder was removed by filtration. Then 2100 g anion exchange resin powder (SAT-10, produced by Mitsubishi Chemicals Corp.) was added to the mixture solution, and the resultant mixture solution was agitated for one hour at the room temperature and at a rotating speed of 200 rpm, and then the added anion exchange resin powder was removed by filtration.

Like in the case of tetrapropyl ammonium hydroxide (TPAOH) described in Example 1, ultra pure water was added to this aqueous solution to adjust the concentration to 10% by weight, and quantities of compounds of alkali metal elements such as sodium (Na) and potassium (K) contained as impurities in the aqueous solution, as well as of compounds of halogen group elements such as bromine (Br) and chlorine (Cl) contained as impurities in the aqueous solution, were measured respectively by the atomic absorption spectrometry method (AAS method) and the ion chromatography method.

Further ultra pure water was added to an aqueous solution of the tetrabutyl ammonium hydroxide (commercially procurable) not having been subjected to the ion exchange processes described above to adjust the concentration to 10% by weight, and contents of impurities contained therein were measured as described above.

As a result, contents of the impurities contained in the aqueous solution not having been subjected to the ion exchange processes were 50 ppm by weight for sodium, 3000 ppm by weight for potassium, 2500 ppm by weight for bromine, and 14 ppm by weight for chlorine as converted to each element respectively, but those of the impurities contained in the aqueous solution having been subjected to the ion exchange processes were 10 ppb by weight or below for sodium (lower limit for detection), 10 ppb by weight or below for potassium (lower limit for detection), 1 ppm by weight or below for bromine, and 1 ppm by weight or below for chlorine as converted to each element respectively.

Then, 85.7 g tetraethyl ortho silicate (TEOS, produced by Tama Chemical Industry Corp.), 127.3 g methyl trimethoxy silane (MTMS, produced by Shin'etsu Kagaku K.K), and 406.4 g ethanol with the concentration of 99.5% by weight (ETOH, produced Wako Jun'yaku K. K) were mixed, and the mixture solution was kept at a temperature of 20° C. and agitated for 30 minutes at a rotating speed of 150 rpm.

Then 380.6 g of highly purified aqueous solution of tetrapropyl ammonium hydroxide (containing TBAOH by 10% by weight) was added into the mixture solution over 10 minutes, and the resultant mixture solution was kept at a temperature of 20° C. and agitated for 1 hour at a rotating speed of 150 rpm. Then the mixture solution was heated to a temperature of 50° C. and agitated keeping the temperature at the level above for 20 hours at a rotating speed of 200 rpm to hydrolyze the components for forming a silica-based coating film (TEOS and MTMS).

Then, like in Example 1, the mixture solution containing hydrolysates of the components for forming a silica-based coating film was subjected to the solvent substitution process for substituting ethanol (organic solvent) contained therein with propylene glycol monopropyl ether (PGP, produced by Nihon Emulsion Co.) using a rotary evaporator, and then concentrations of silicon compounds comprising hydrolysates of tetraethyl ortho silicate (TEOS) and methyltrimethoxy silane (MTMS) were adjusted to obtain liquid compositions each containing the compounds by 12% by weight in terms of $SiO_2$ (Example of coating liquid ④). The requirements for preparation of the liquid compositions (coating liquid for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ④) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 5

85.7 g tetraethyl ortho silicate (TEOS produced by Tama Chemical Industry Corp.) and 146.6 g ethanol with the concentration of 99.5% by weight (ETOH, produced Wako Jun'yaku K. K) were mixed with each other, and the mixture solution was kept at a temperature of 20° C. and agitated for 30 minutes at a rotating speed of 150 rpm. Then 89.5 g aqueous solution of the highly purified tetrapropyl ammonium hydroxide (containing TPAOH by 10% by weight) was added into the mixture solution over 10 minutes, and agitated for 2 hours at a temperature of 20° C. and at a rotating speed of 150 rpm. Then the mixture solution was heated to 50° C. and agitated at the temperature and at a rotating speed of 200 rpm to hydrolyze the tetraethyl ortho silicate.

Then an aqueous solution prepared by mixing 127.3 g methyl trimethoxy silane (MTMS, produced by Shin'etsu Chemical Industry Corp.) with 342.1 g ethanol with the concentration of 99.5% by weight (ETOH, produced by Wako Jun'yaku K. K) was mixed in the mixture solution described above, and the resultant mixture solution was kept at a temperature of 20° C. and agitated for 10 minutes at a rotating speed of 150 rpm.

Then 208.8 g of highly purified aqueous solution of tetrapropyl ammonium hydroxide (containing TPAOH by 10% by weight) was added into the mixture solution over 10 minutes, and the resultant mixture solution was kept at a temperature of 20° C. and agitated for 1 hour at a rotating speed of 150 rpm. Then the mixture solution was heated to a temperature of 50° C. and agitated keeping the temperature at the level above for 25 hours at a rotating speed of 200 rpm to hydrolyze methyl trimethoxy silane (MTMS) and the components to be hydrolyzed (partial hydrolysate of tetraethyl ortho silicate).

Then, like in Example 1, the mixture solution containing hydrolysates of the components for forming a silica-based coating film was subjected to the solvent substitution process for substituting ethanol in the mixture solution with propylene glycol monopropyl ether (PGP) using a rotary evaporator, and then concentration of a silicon compound comprising hydrolysates of tetraethyl ortho silicate (TEOS) and methyl trimethoxy silane (MTMS) was adjusted to obtain liquid compositions containing the compound by 12% by weight in terms of $SiO_2$ (Example of coating liquid ⑤). The requirements for preparation of the liquid compositions (coating liquids for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ⑤) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 6

85.7 g tetraethyl ortho silicate (TEOS, produced by Tama Chemical Industry Corp.) and 146.6 g ethanol with the concentration of 99.5% by weight (ETOH, produced Wako Jun'yaku K. K) were mixed with each other, and the mixture solution was kept at a temperature of 20° C. and agitated for 30 minutes at a rotating speed of 150 rpm.

Then 89.5 g aqueous solution of the highly purified tetrapropyl ammonium hydroxide (containing TPAOH by 10% by weight) was added into the mixture solution over 10 minutes, and agitated for 5 hours at a temperature of 20° C. and at a rotating speed of 150 rpm. Then the mixture solution was heated to 50° C. and agitated at the temperature and at a rotating speed of 200 rpm for 40 hours to hydrolyze the tetraethyl ortho silicate.

Then 127.3 g methyl trimethoxy silane (MTMS, produced by Shin'etsu Chemical Industry Corp.) and 342.1 g ethanol with the concentration of 99.5% by weight (ETOH, produced by Wako Jun'yaku K. K) were mixed with each other, and the resultant mixture solution was kept at a temperature of 20° C. and agitated for 30 minutes at a rotating speed of 150 rpm.

Then 208.8 g of highly purified aqueous solution of tetrapropyl ammonium hydroxide (containing TPAOH by 10% by weight) was added into the mixture solution over 10 minutes, and the resultant mixture solution was kept at a temperature of 20° C. and agitated for 2 hours at a rotating speed of 150 rpm. Then the mixture solution was heated to a temperature of 50° C. and agitated keeping the temperature at the level above for 5 hours at a rotating speed of 200 rpm to hydrolyze methyl trimethoxy silane (MTMS) partially. Next, the mixture solution was mixed, heated to 50° C. and agitated at the temperature and at a rotating speed of 200 rpm for 20 hours to hydrolyze the components for forming a silica-based coating film (a partial hydrolysate of TEOS and MTMS).

Then, like in Example 1, the mixture solution containing hydrolysates of the components for forming a silica-based coating film was subjected to the solvent substitution process for substituting ethanol in the mixture solution with propylene glycol monopropyl ether (PGP) using a rotary evaporator, and then concentration of a silicon compound comprising hydrolysates of tetraethyl ortho silicate (TEOS) and methyl trimethoxy silane (MTMS) was adjusted to obtain liquid compositions containing the compound by 12% by weight in terms of $SiO_2$ (Example of coating liquid ⑥). The requirements for preparation of the liquid compositions (coating liquids for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ⑥) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 7

77.1 g tetraethyl silicate (TEOS, produced by Tama Chemical Industry Corp.), 114.5 g methyl trimethoxy silane (MTMS, produced by Shin'etsu Chemical Industry Corp.), 80.0 g polysiloxane (PS, a product with the concentration of 10% by weight in terms of $SiO_2$ prepared by the method described in Japanese Patent Laid-Open Publication No. 1997-315812), and 430.1 g ethanol with the concentration of 99.5% by weight (ETOH, produced by Wako Jun'yaku Corp.) were mixed with each other, and the mixture solution was kept at a temperature of 20° C. and agitated for 30 minutes at a rotating speed of 150 rpm.

Then 298.3 g aqueous solution of the highly purified tetrapropyl ammonium hydroxide (including TPAOH by 10% by weight) was added into the mixture solution over 10 minutes, and further was agitated at a temperature of 20° C. for one hour at a rotating speed of 150 rpm. Then the mixture solution was heated to 50° C., and agitated at the temperature for 20 hours at a rotating speed of 200 rpm to hydrolyze the components for forming a silica-based coating film (TEOS and MTMS).

Then, like in the case of Example 1, the mixture solution containing hydrolysates of the components for forming a silica-based coating film was subjected to the solvent substitution process for substituting ethanol in the mixture solution with propylene glycol monopropyl ether (PGP) using a rotary evaporator, and then concentration of a silicon compound comprising hydrolysates of tetraethyl ortho silicate (TEOS) and methyl trimethoxy silane (MTMS) was adjusted to obtain liquid compositions containing the compound by 12% by weight in terms of $SiO_2$ (Example of coating liquid ⑦). The requirements for preparation of the liquid compositions (coating liquids for forming a coating film) are as shown in Table 1.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrate was subjected to the heating step as well as to the curing step under the same conditions as those employed in Example 1. Further the substrates (Example substrate ⑦) was cooled down to a temperature around the room temperature, and taken out from the system.

The film thickness of the silica-based coating film formed on a substrate obtained as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Example 8

85.7 g tetraethyl ortho silicate (TEOS, produced by Tama Chemical Industry Corp.), 127.3 g methyl trimethoxy silane (MTMS, produced by Shin'etsu Chemical Industry Corp.), and 488.7 g ethanol with the concentration of 99.5% by weight (ETOH, produced by Wako Jun'yaku Corp.) were mixed with each other, and the mixture solution was kept at a temperature of 20° C. and agitated for 30 minutes at a rotating speed of 150 rpm.

This mixture solution was added into 298.3 g aqueous solution of the highly purified tetrapropyl ammonium hydroxide being kept at a temperature of 20° C. and agitated at a rotating speed of 150 rpm over one hour, and further the resultant mixture solution was agitated for one hour at a temperature of 20° C. and at a rotating speed of 150 rpm (The adding method was different from that employed in Example 1).

The mixture solution was heated to the temperature shown in Table 2, and the mixture solution was agitated for a period of time shown in Table 2 at the temperature and at a rotating speed of 200 rpm to hydrolyze the components for forming a silica-based coating film (TMOS and MTMS).

Then, like in Example 1, the mixture solution containing hydrolysates of the components for forming a silica-based coating film was subjected to the solvent substitution process for substituting ethanol (organic solvent) in the mixture solution with propylene glycol monopropyl ether (PGP) using a rotary evaporator, and then concentration of silicon compounds comprising hydrolysates of tetraethyl ortho silicate (TEOS) and methyl trimethoxy silane (MTMS) were adjusted to obtain liquid compositions (Examples of coating liquids ⑧-1 to ⑧-6) each containing the compound at a ratio shown in Table 2 (as converted to $SiO_2$). The requirements for preparation of the liquid compositions (coating liquids each for forming a coating liquid) are as shown in Table 2.

5 ml of the coating liquid for forming a coating film obtained as described above was applied on a silicon wafer substrate (semiconductor substrate) with the size of 8×8 square inches using the spin coat method under the same conditions as those employed in Example 1.

Then the substrates were subjected to the heating step as well as to the curing step under the same conditions as those employed in Example 1. Further the substrates (Examples of coating liquids ⑧-1 to ⑧-6) were cooled down to a temperature around the room temperature, and taken out from the system.

The film thickness of the silica-based coating film on a substrate as described above was about 500 nm.

Then, like in Example 1, the silica-based coating film formed on a substrate was measured for the specific dielectric constant, a change rate in moisture absorption by the coating film before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 6.

Comparative Example 1

Tetraethyl ortho silicate (TEOS, produced by Tama Chemical Industry Corp.), methyl trimethoxy silane (MTMS, produced by Shin'etsu Chemical Industry Corp.), and ethanol with the concentration of 5% by weight (ETOH, produced by Wako Jun'yaku Corp.) were mixed at the respectively mixing ratios shown in Table 3, and the mixture solution was kept at a temperature of 20° C. and agitated for 30 minutes at a rotating speed of 150 rpm.

An aqueous solution of the highly purified tetrapropyl ammonium hydroxide (containing TPAOH by 10 weight %) was added into the mixture solution above over 10 minutes at the mixing ratio shown in Table 1, and the resultant mixture solution was agitated for one hours at 20° C. and at a rotating speed of 250 rpm. Then the mixture solution was heated to 50° C. and agitated for 20 hours at the temperature and at a rotating speed of 250 rpm to hydrolyze the components for forming a silica-based coating film (TEOS and MTMS).

Then, like in the case of Example 1, the mixture solution containing hydrolysates of the components for forming a silica-based coating film was subjected to the solvent substitution process for substituting ethanol in the mixture solution to propylene glycol monopropyl ether (PGP) using a rotary evaporator, and then concentration of silicon compounds comprising hydrolysates of tetraethyl ortho silicate (TEOS) and methyl trimethoxy silane (MTMS) were adjusted to obtain liquid compositions containing the compound by 12% by weight in terms of $SiO_2$ (Comparative examples of coating liquids ①-1 to ①-4). The requirements for preparation of the liquid compositions (coating liquids each for forming a coating liquid) are as shown in Table 3.

5 ml of the coating liquid for forming a coating film obtained as described above was applied on a silicon substrate with the size of 8×8 square inches using the spin coat method under the same conditions as those employed in Example 1.

Then the substrates were subjected to the heating step as well as to the curing step under the same conditions as those employed in Example 1. Further, the substrates (Comparative examples of substrates ①-1 to ①-4) were cooled down to a temperature around the room temperature, and taken out from the system.

The film thickness of the silica-based coating film formed on a substrate as described above was about 500 nm.

Next, like in the case of Example 1, the silica-based coating film formed on a substrate was measured for the specific dielectric constant (if the coating film would absorb moisture, the dielectric constant was also measured after left for one day in the air), a change rate in moisture absorption by the coating liquid before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Comparative Example 2

85.7 g tetraethyl ortho silicate (TEOS, produced by Tama Chemical Industry Corp.), 127.3 g methyl trimethoxy silane (MTMS, produced by Shin'etsu Chemical Industry Corp.), and 488.7 g ethanol with the concentration of 5% by weight (ETOH, produced by Wako Jun'yaku Corp.) were mixed with each other, and the mixture solution was kept at a temperature of 20° C. and agitated for 30 minutes at a rotating speed of 150 rpm.

298.3 g of an aqueous solution of the not highly purified tetrapropyl ammonium hydroxide (containing TPAOH by 10 weight %) was added into the mixture solution above over 10 minutes, and the resultant mixture solution was agitated for one hours at 20° C. and at a rotating speed of 150 rpm. Then the mixture solution was heated to 50° C. and agitated for 20 hours at the temperature and at a rotating speed of 200 rpm to hydrolyze the components for forming a silica-based coating film (TEOS and MTMS).

Then, like in the case of Example 1, the mixture solution containing hydrolysates of the components for forming a silica-based coating film was subjected to the solvent substitution process for substituting ethanol (organic solvent) in the mixture solution to propylene glycol monopropyl ether (PGP) using a rotary evaporator, and then concentration of silicon compounds comprising hydrolysates of tetraethyl ortho silicate (TEOS) and methyl trimethoxy silane (MTMS) were adjusted to obtain liquid compositions containing the compound by 12% by weight in terms of $SiO_2$ (Comparative example of coating liquids ②). The requirements for preparation of the liquid compositions (coating liquids each for forming a coating liquid) are as shown in Table 3.

5 ml of the coating liquid for forming a coating film obtained as described above was applied on a silicon substrate with the size of 8×8 square inches using the spin coat method under the same conditions as those employed in Example 1.

Then the substrate was subjected to the heating step as well as to the curing step under the same conditions as those employed in Example 1. Further the substrate (Comparative example of substrate ②) was cooled down to a temperature around the room temperature, and taken out from the system.

The film thickness of the silica-based coating film formed on a substrate as described above was about 500 nm.

Next, like in the case of Example 1, the silica-based coating film formed on a substrate was measured for the specific dielectric constant (if the coating film would absorb moisture, the dielectric constant was also measured after left for one day in the air), a change rate in moisture absorption by the coating liquid before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Comparative Example 3

By employing the same method as the known ones (described, for instance, in non-patent document 1, patent document 6), 285.7 g tetraethyl ortho silicate (TEOS, produced by Tama Chemical Industry Corp.), and 574.3 g ethanol with the concentration of 5% by weight (ETOH, produced by Wako Jun'yaku Corp.) were mixed with each other, and the mixture solution was kept at a temperature of 20° C. and was agitated for 30 minutes at a rotating speed of 150 rpm.

140.0 g of an aqueous solution of the not highly purified tetrapropyl ammonium hydroxide (containing TPAOH by 21.3% by weight) was added into the mixture solution above over 2 hours, and the resultant mixture solution was agitated for three days at 20° C. and at a rotating speed of 150 rpm. Then the mixture solution was heated to 80° C. and agitated for 3 days at the temperature and at a rotating speed of 200 rpm to hydrolyze the tetraethyl ortho silicate (TEOS).

As a mixture solution with white turbidity was obtained, and this solution was processed for 20 minutes in a centrifugal separator at a rotating speed of 2000 rpm to remove large particles.

Then, like in the case of Example 1, the mixture solution was subjected to the solvent substitution process for substituting ethanol contained in this mixture solution with propylene glycol monopropyl ether (PGP) using a rotary evaporator, and then the concentration of silicon compounds comprising a hydrolysate of tetraethyl ortho silicate (TEOS) to obtain a liquid composition containing the compound by 12% by weight in terms of $SiO_2$ (Comparative example of coating liquid ③). The requirements for preparation of this liquid composition (coating liquid for forming a coating film) is as shown in Table 3.

5 ml of the coating liquid for forming a coating film obtained as described above was applied on a silicon substrate with the size of 8×8 square inches using the spin coat method under the same conditions as those employed in Example 1.

Then the substrate was subjected to the heating step as well as to the curing step under the same conditions as those employed in Example 1. Further the substrate (Comparative example of substrate ③) was cooled down to a temperature around the room temperature, and taken out from the system.

The film thickness of the silica-based coating film formed on a substrate as described above was about 500 nm.

Next, like in the case of Example 1, the silica-based coating film formed on a substrate was measured for the specific dielectric constant (if the coating film would absorb moisture, the dielectric constant was also measured after left for one day in the air), a change rate in moisture absorption by the coating liquid before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

Figure 2:
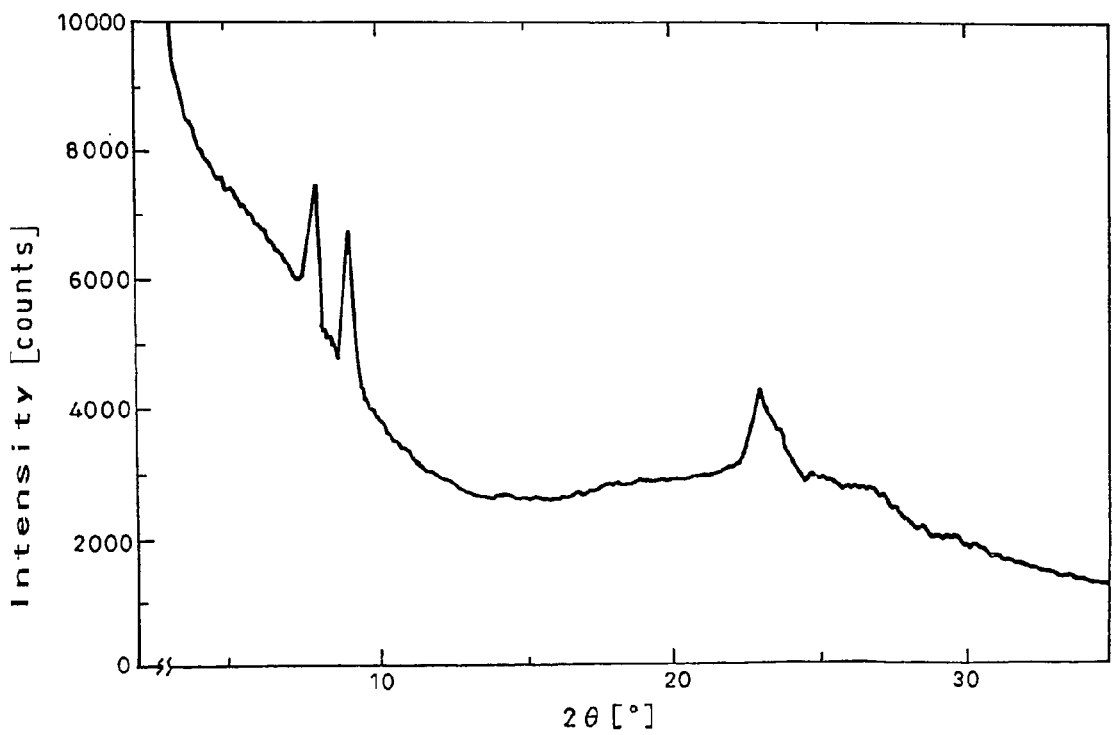

The result is shown in Table 5. Further a result of X-ray diffraction of the silica-based coating film formed on the substrate is shown in FIG. 2.

Comparative Example 4

Like in the case of Comparative Example 3, 285.7 g tetraethyl ortho silicate (TEOS, produced by Tama Chemical Industry Corp.), and 574.3 g ethanol with the concentration of 99.5% by weight (ETOH, produced by Wako Jun'yaku Corp.) were mixed with each other, and the mixture solution was kept at a temperature of 20° C. and was agitated for 30 minutes at a rotating speed of 150 rpm.

140.0 g of an aqueous solution of the highly purified tetrapropyl ammonium hydroxide (containing TPAOH by 21.3% by weight) was added into the mixture solution above over 2 hours, and the resultant mixture solution was agitated for three days at 20° C. and at a rotating speed of 150 rpm. Then the mixture solution was heated to 80° C. and agitated for 3 days at the temperature and at a rotating speed of 200 rpm to hydrolyze the tetraethyl ortho silicate (TEOS). Different from the case of Comparative Example 3, a product with white turbidity was not obtained.

Then, in the case of Example 1, the mixture solution was subjected to the solvent substitution process for substituting ethanol contained in this mixture solution with propylene glycol monopropyl ether (PGP) using a rotary evaporator, and then the concentration of silicon compounds comprising a hydrolysate of tetraethyl ortho silicate (TEOS) to obtain a liquid composition (Comparative example of coating liquid ④) containing the compound by 12% by weight in terms of $SiO_2$. The requirements for preparation of this liquid composition (coating liquid for forming a coating film) is as shown in Table 3.

5 ml of the coating liquid for forming a coating film obtained as described above was applied on a silicon substrate with the size of 8×8 square inches using the spin coat method under the same conditions as those employed in Example 1.

Then the substrate was subjected to the heating step as well as to the curing step under the same conditions as those employed in Example 1. Further the substrate (Comparative example of coating liquid ④) was cooled down to a temperature around the room temperature, and taken out from the system.

The film thickness of the silica-based coating film formed on a substrate as described above was about 500 nm.

Next, like in the case of Example 1, the silica-based coating film formed on a substrate was measured for the specific dielectric constant (if the coating film would absorb moisture, the dielectric constant was also measured after left for one day in the air), a change rate in moisture absorption by the coating liquid before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 5.

Comparative Example 5

85.7 g tetraethyl ortho silicate (TEOS, produced by Tama Chemical Industry Corp.), 127.3 g methyl trimethoxy silane (MTMS, produced by Shin' etsu Chemical Inductry Corp.), and 488.7 g ethanol with the concentration of 99.5% by weight (ETOH, produced by Wako Jun'yaku Corp.) were mixed with each other, and the mixture solution was kept at a temperature of 20° C. and agitated for 30 minutes at a rotating speed of 150 rpm.

This mixture solution was gradually added into 298.3 g aqueous solution of the highly purified tetrapropyl ammonium hydroxide (containing TPAOH by 10% by weight) over one hour, and the resultant mixture solution was agitated for one hour at 20° C. and at a rotating speed of 150 rpm (Namely, the adding method is different from that employed in Example 1).

Then, the mixture solution was heated to the temperature shown in Table 4 and was agitated for a period of time shown in Table 4 at the temperature and at a rotating speed of 200 rpm to hydrolyze the components for forming a silica-based coating film (TMOS and MTMS).

Next, like in the case of Example 1, the mixture solution containing hydrolysates of the components for forming a silica-based coating film was subjected to the solvent substitution process for substituting ethanol (organic solvent) in the mixture solution with propylene glycol monopropyl ether (PGP) using a rotary evaporator, and then the concentrations of the silicon compounds comprising tetraethyl ortho silicate (TEOS) and methytrimethoxy silane (MTMS) to obtain liquid compositions (Comparative examples of coating liquids ⑤-1 to ⑤-6) each containing the compound at a ratio shown in Table 4 (in terms of $SiO_2$). The requirement for preparation of the liquid composition (coating liquid for forming a coating film) are as shown in Table 4.

5 ml of the coating liquid for forming a coating film obtained as described above was applied on a silicon substrate with the size of 8×8 square inches using the spin coat method under the same conditions as those employed in Example 1.

Then the substrates were subjected to the heating step as well as to the curing step under the same conditions as those employed in Example 1. Further the substrates (Comparative examples of substrates ⑤-1 to ⑤-6) were cooled down to a temperature around the room temperature, and taken out from the system.

The film thickness of the silica-based coating film formed on a substrate was about 500 nm.

Next, like in the case of Example 1, the silica-based coating film formed on a substrate was measured for the specific dielectric constant, a change rate in moisture absorption by the coating liquid before and after irradiation of an oxygen plasma, film strength, surface roughness, pore distribution (average diameter of pores and volume percentage of micropores each with the diameter of 2 nm or below against the total volume), and X-ray diffraction peaks (determined for an crystalline coating film or an amorphous coating film).

The result is shown in Table 6.

As clearly understood from the result of measurement shown in Table 5, when a coating liquid is formed on a substrate with the coating liquid for forming a coating film according to the present invention, it is possible to form an amorphous silica-based coating film with the specific dielectric constant of 2.5 or below and the film strength expressed by Young's modulus of 6.0 GPa or more.

Further as this silica-based coating film itself has the excellent hydrophobic property (moisture absorption resisting characteristics), so that the coating film can preserve the hydrophobic property for a long time without being subjected to a surface processing such as silylation recommended in the known examples (non-patent document 1, patent document 6 and the like), and as a result degradation of dielectric constant never occurs. In addition, it has been found that the amorphous silica-based coating film has not only more excellent hydrophobic property as compared to a crystalline coating liquid such as a zeolitic coating film, but also the surface smoothness with irregularities of 1 nm or less. The average diameter of pores in the silica-based coating film is 3 nm or less, and volume percentage of micropores each with the diameter of 2 nm or less was 70% or more.

Further, it has been found that, when the coating liquid for forming a coating film is to be prepared, it is necessary to remove impurities comprising compounds of alkali metal elements such as sodium (Na) and potassium (K) contained in the tetraalkyl ammonium hydroxide (TAAOH) used in the preparation process to the revel described above.

Further it has been found that a desired silica-based coating film can not always be obtained unless, in preparation of the coating liquid for forming a coating film, a molar ratio of tetraalkyl ortho silicate (TAOS) such as TEOS versus alkoxysilane (AS) such as MTMS (TAOS/AS) in the range from 6/4 to 2/8 in terms of $SiO_2$ and also adjusting a molar ratio (TAAOH/(TAOS+AS)) of tetraalkyl ammonium hydroxide (TAAOH) versus components for forming a coating film (TAOS+AS) in the range from 1/10 to 7/10 also in terms of $SiO_2$. Further it has been found that, even when polysiloxane (PS) is contained at the mixing ratio described above, the specific dielectric constant and strength of the coating film are not affected.

In contrast, when a coating film is formed on a substrate using any of the coating liquids each for forming a coating film described in Comparative Examples, although a portion of the properties described above could be obtained, all of the properties or effects could not always be shown. Namely the coating liquids described in Comparative Examples can not satisfy the recent requirements from semiconductor manufacturers.

With Comparative examples of substrates ③ and ④ (using the coating liquids each for forming a coating film prepared without using alkoxysilane (AS) such as MTMS), it is possible to obtain a coating film having the Young's modulus of 6.0 GPa or more, but the surface roughness is substantially remarkable, and it has been found that, when the substrate is left in the atmospheric air for one day, the specific dielectric constant rapidly increased from 2.3 to 3.0. Because of the characteristics, it is necessary to subject a surface of the substrate to polishing and silylation for practically using the substrate. With Comparative example of substrate ② (using the coating liquids each for forming a coating film prepared with the tetrapropyl ammonium hydroxide (TPAOH) containing impurities and not having been highly purified), although a silica-based coating film having a desired dielectric constant and strength can be obtained, a portion of the coating film is crystallized, and the surface roughness of 1 nm or more was observed.

Further, with Comparative examples of substrates ①-1 and ①-3, the required film strength can not be obtained, and with Comparative examples of substrates ①-2 and ①-4, the desired dielectric constant can not be obtained. In addition, with Comparative example of substrate ①-2, the moisture absorption rate increases, and when the substrate is left for one day in the atmospheric air, the desired specific dielectric constant will be lost.

Further, as clearly understood from the measurement result shown in Table 6, when a coating film is formed on a substrate using a coating liquid obtained from the preparation method according to the present invention, it is possible to obtain an amorphous silica-based coating film having the specific dielectric constant of 2.5 or below and high film strength expressed by Young's modulus of 6.0 GPa or more can be obtained.

Especially in the method of preparing the coating liquid A, it has been found that hydrolysis should be performed for a period of time in the range from 1 to 72 hours at a temperature in the range from 30 to 80° C. It has also been recognized that the contents of the components (silicon compounds, or silicon compounds and PS) for forming a silica-based coating film contained in a coating liquid should be in the range from 5 to 40% by weight. The method of preparing the coating liquid B is not described in Examples, but the same conditions as those for the coating liquid A may be employed.

In contrast, when a coating film is formed on a substrate by using a coating liquid prepared by any of the preparation methods described in Comparative Examples, although a portion of the characteristics described above can be obtained, all of the properties or effects can not always be shown.

It has also been found that, when the temperature employed for hydrolysis is less than 30° C., the specific dielectric constant of 2.5 or below and film strength expressed by Young's modulus of 6.0 GPa or more can not be obtained because the tetraalkyl ortho silicate (TAOS) and alkoxysilane (AS) are not completely hydrolyzed within a prespecified period of time. Further it has been found that, when the temperature is over 80° C., the reaction speed in hydrolysis is too fast, and a coating film having homogeneity and micropores as desired in the present invention (namely micropores with nano-cluster size having the average diameter of 3 nm or below and volume percentage of micropore each with the diameter of 2 nm or below against the total pore volume of 70% or more) can hardly be formed, and that, as a result, the desired film strength can hardly be obtained.

Still further it has been found that, when the time for hydrolysis is less than one hour (total time for hydrolysis in a case of the coating liquid B), the same problems as those occurring when the temperature for hydrolysis is less than 30° C. occur although the phenomenon varies according to other conditions in preparation, and also that, when the time is over 72 hours, the long term stability of the coating liquid will worsen.

It has also been found that, when the concentrations of the components for forming a coating film (silicon compounds, or silicon compounds and polysiloxane) are less than 2% by weight, a homogeneous coating film can be formed, and that, when the concentrations are over 40% by weight, the long term stability of the coating liquid will worsen.

As clearly understood from the descriptions above, it can be said that the coating liquid for forming a coating film according to the present invention is most suited to formation of a low dielectric constant amorphous silica-based coating film having a high film strength and excellent hydrophobic property (e.g., the moisture absorption resisting characteristics) with its surface being smooth or even.

TABLE 1

Examples of coating liquids

| Example No. | Mixed amount of TEOS or TMOS (g) | Mixed amount of MTES (g) | Mixed amount of ETOH (g) | Added amount of TPAOH or TBAOH solution (g) | Molar ratio of TAOS/AS (in terms of SiO$_2$) | Molar ratio of TAAOH/(TAOS + AS) (in terms of SiO$_2$) |
|---|---|---|---|---|---|---|
| ①-1 | 57.1 | 145.5 | 499.1 | 298.3 | 2/8 | 1.1/10 |
| ①-2 | 85.7 | 127.3 | 488.7 | 298.3 | 3/7 | 1.1/10 |
| ①-3 | 85.7 | 127.3 | 488.7 | 1084.7 | 3/7 | 4/10 |
| ①-4 | 53.6 | 79.5 | 273.7 | 593.2 | 3/7 | 7/10 |
| ①-5 | 142.9 | 90.9 | 467.9 | 298.3 | 5/5 | 1.1/10 |
| ①-6 | 142.9 | 90.9 | 467.9 | 1084.7 | 5/5 | 4/10 |
| ①-7 | 89.3 | 56.8 | 260.7 | 593.2 | 5/5 | 7/10 |
| ①-8 | 171.4 | 72.7 | 457.6 | 298.3 | 6/4 | 1.1/10 |
| ② | 60.8 (TMOS) | 127.3 | 513.6 | 298.3 | 3/7 | 1.1/10 |
| ③ | 85.7 | 166.2 (MTES) | 449.8 | 298.3 | 3/7 | 1.1/10 |
| ④ | 85.7 | 127.3 | 406.4 | 380.6 (TBOH) | 3/7 | 1.1/10 |
| ⑤ | 85.7 | 127.3 | 488.7 (Total) | 298.3 (Total) | 3/7 | 1.1/10 |
| ⑥ | 85.7 | 127.3 | 488.7 (Total) | 298.3 (Total) | 3/7 | 1.1/10 |
| ⑦ | 77.1 | 114.5 | 430.1 | 298.3 | 3/7 | 1.1/10 (containing PS by 10% by weight) |

TABLE 2

Conditions for preparing coating liquids in Examples

| Example No. | Molar ratio of TEOS/MTMS (in terms of SiO$_2$) | Molar ratio of TPAOH/(TEOS + MTMS) (in terms of SiO$_2$) | Temperature of hydrolysis reaction (° C.) | Time of hydrolysis reaction (Hrs) | Content of components for forming silica-based coating film (% by weight) |
|---|---|---|---|---|---|
| ⑧-1 | 3/7 | 1.1/10 | 35 | 60 | 12 |
| ⑧-2 | 3/7 | 1.1/10 | 70 | 10 | 12 |
| ⑧-3 | 3/7 | 1.1/10 | 50 | 20 | 12 |
| ⑧-4 | 3/7 | 1.1/10 | 50 | 48 | 12 |
| ⑧-5 | 3/7 | 1.1/10 | 50 | 20 | 8 |
| ⑧-6 | 3/7 | 1.1/10 | 50 | 20 | 30 |

TABLE 3

Comparative Examples of coating liquids

| Comparative Example No. | Mixed amount of TEOS (g) | Mixed amount of MTMS (g) | Mixed amount of ETOH (g) | Added amount of TPAOH solution (g) | Molar ratio of TAOS/MTMS (in terms of SiO$_2$) | Molar ratio of TAAOH/(TAOS + AS) (in terms of SiO$_2$) |
|---|---|---|---|---|---|---|
| ①-1 | 28.6 | 163.6 | 509.5 | 298.3 | 1/9 | 1.1/10 |
| ①-2 | 200.0 | 54.5 | 447.2 | 298.3 | 7/3 | 1.1/10 |
| ①-3 | 85.7 | 127.3 | 597.2 | 189.8 | 3/7 | 0.7/10 |
| ①-4 | 53.6 | 79.5 | 189.0 | 677.9 | 3/7 | 8/10 |
| ② | 85.7 | 127.3 | 488.7 | 298.3 (containing impurities) | 3/7 | 1.1/10 |
| ③ | 285.7 | 0 | 574.3 | 140.0 (containing impurities) | 10/0 | 1.1/10 |
| ④ | 285.7 | 0 | 574.3 | 140.0 | 10/0 | 1.1/10 |

TABLE 4

Conditions for preparing coating liquids in Comparative Examples

| Comparative Example No. | Molar ratio of TEOS/MTMS (in terms of $SiO_2$) | Molar ratio of TPAOH/(TEOS + MTMS) (in terms of $SiO_2$) | Temperature of hydrolysis reaction (° C.) | Time of hydrolysis reaction (Hrs) | Content of components for forming silica-based coating film (% by weight) |
|---|---|---|---|---|---|
| ⑤-1 | 3/7 | 1.1/10 | 25 | 60 | 12 |
| ⑤-2 | 3/7 | 1.1/10 | 90 | 10 | 12 |
| ⑤-3 | 3/7 | 1.1/10 | 50 | 0.5 | 12 |
| ⑤-4 | 3/7 | 1.1/10 | 50 | 80 | 12 |
| ⑤-5 | 3/7 | 1.1/10 | 50 | 20 | 1 |
| ⑤-6 | 3/7 | 1.1/10 | 50 | 20 | 45 |

TABLE 5

Measurement results (A) of coating films

| Example No. | Comparative Example No. | Specific dielectric constant (Value in parenthesis is that left in the air for 1 day) | Change of moisture absorption after oxygen plasma irradiation (Yes or No) | Film strength of coating film (Young's modulus) (GPa) | Surface roughness of coating film (Rms) (nm) | Average pore diameter (nm) and volume percentage of micropores (%) | X ray diffraction peaks (crystalline or amorphous) |
|---|---|---|---|---|---|---|---|
| ①-1 | | 2.2 | No | 6 | 0.7 | 2.7/72 | Amorphous |
| ①-2 | | 2.3 | No | 9 | 0.6 | 2.5/75 | Amorphous |
| ①-3 | | 2.3 | No | 9 | 0.5 | 2.4/75 | Amorphous |
| ①-4 | | 2.3 | No | 8 | 0.6 | 2.3/76 | Amorphous |
| ①-5 | | 2.4 | No | 9 | 0.6 | 2.1/76 | Amorphous |
| ①-6 | | 2.4 | No | 9 | 0.6 | 2.1/75 | Amorphous |
| ①-7 | | 2.4 | No | 8 | 0.6 | 2.6/78 | Amorphous |
| ①-8 | | 2.4 | No | 10 | 0.7 | 2.2/77 | Amorphous |
| ② | | 2.3 | No | 10 | 0.6 | 2.3/77 | Amorphous |
| ③ | | 2.3 | No | 9 | 0.7 | 2.4/76 | Amorphous |
| ④ | | 2.3 | No | 8 | 0.6 | 2.4/77 | Amorphous |
| ⑤ | | 2.4 | No | 6 | 0.6 | 2.3/75 | Amorphous |
| ⑥ | | 2.4 | No | 6 | 0.6 | 2.3/76 | Amorphous |
| ⑦ | | 2.4 | No | 7 | 0.6 | 2.4/75 | Amorphous |
| | ①-1 | 2.9 | No | 2 | 2.5 | 2.8/71 | Amorphous |
| | ①-2 | 2.6 (3.0) | Yes (Moisture absorption increased) | 10 | 0.7 | 2.2/78 | Amorphous |
| | ①-3 | 2.4 | No | 5 | 0.6 | 2.3/73 | Amorphous |
| | ①-4 | 2.6 | No | 7 | 0.6 | 2.5/71 | Amorphous |
| | ② | 2.3 | No | 12 | 2.7 | 2.4/75 | Partially Crystalline |
| | ③ | 2.3 (3.0) | Yes (Moisture absorption increased) | 11 | 4.1 | 2.2/74 | Crystalline |
| | ④ | 2.3 (3.0) | Yes (Moisture absorption increased) | 9 | 3.1 | 2.4/72 | Amorphous |

TABLE 6

Measurement results (B) of coating films

| Example No. | Comparative Example No. | Specific dielectric constant (Value in parenthesis is that left in the air for 1 day) | Change of moisture absorption after oxygen plasma irradiation (Yes or No) | Film strength of coating film (Young's modulus) (GPa) | Average pore diameter (nm) and volume percentage of micropores (%) | Appearance of coating films and other observations |
|---|---|---|---|---|---|---|
| ⑧-1 | | 2.3 | No | 9 | 2.4/76 | Good |
| ⑧-2 | | 2.2 | No | 8 | 2.7/72 | Good |
| ⑧-3 | | 2.3 | No | 9 | 2.5/75 | Good |

TABLE 6-continued

Measurement results (B) of coating films

| Example No. | Comparative Example No. | Specific dielectric constant (Value in parenthesis is that left in the air for 1 day) | Change of moisture absorption after oxygen plasma irradiation (Yes or No) | Film strength of coating film (Young's modulus) (GPa) | Average pore diameter (nm) and volume percentage of micropores (%) | Appearance of coating films and other observations |
|---|---|---|---|---|---|---|
| ⑧-4 | | 2.3 | No | 9 | 2.5/75 | Good |
| ⑧-5 | | 2.3 | No | 9 | 2.5/75 | Good |
| ⑧-6 | | 2.3 | No | 9 | 2.5/75 | Good |
| | ⑤-1 | 2.5 | No | 5 | 2.1/76 | Good |
| | ⑤-2 | 2.1 | No | 3 | 3.5/60 | Good |
| | ⑤-3 | 2.5 | No | 4 | 2.1/76 | Good |
| | ⑤-4 | 2.1 | No | 3 | 3.2/65 | Good |
| | ⑤-5 | — | — | — | — | Uneven film thickness (*) |
| | ⑤-6 | — | — | — | — | Solution gelled (*) |

(*) Evaluation impossible

What is claimed is:

1. A coating liquid for forming an amorphous silica-based coating film with a low dielectric constant on a substrate, said coating liquid comprising:
a silicon compound obtained by hydrolyzing tetraalkyl ortho silicate (TAOS) and alkoxysilane (AS) represented by the following general formula (I) in the presence of purified tetraalkyl ammonium hydroxide (TAAOH) without containing impurities comprising compounds of alkali metal elements and halogen group elements, a molar ratio of TAOS:AS being in a range of 6/4 to 2/8 and a molar ratio of TAAOH:(TAOS+AS) being in a range of 1/10 to 7/10, and
said purified tetraalkyl ammonium hydroxide (TAAOH),

$X_n Si(OR)_{4-n}$      (I)

wherein X indicates a hydrogen atom, a fluorine atom, or an alkyl group, a fluorine-substituted alkyl group, an aryl group or a vinyl group each having 1 to 8 carbon atoms; R indicates a hydrogen atom, or an alkyl group, an aryl group or a vinyl group each having 1 to 8 carbon atoms; and n is an integral number from 1 to 3.

2. A coating liquid for forming an amorphous silica-based coating film with a low dielectric constant on a substrate, said coating liquid comprising:
a silicon compound obtained by hydrolyzing or partially hydrolyzing tetraalkyl ortho silicate (TAOS) in the presence of purified tetraalkyl ammonium hydroxide (TAAOH) without containing impurities comprising compounds of alkali metal elements and halogen group elements, mixing a reaction product with alkoxysilane (AS) represented by the following general formula (I) or a hydrolysate or a partial hydrolysate thereof, and further hydrolyzing all or a portion of a mixture:

$X_n Si(OR)_{4-n}$      (I)

wherein X indicates a hydrogen atom, a fluorine atom, or an alkyl group, a fluorine-substituted alkyl group, an aryl group or a vinyl group each having 1 to 8 carbon atoms; R indicates a hydrogen atom, or an alkyl group, an aryl group or a vinyl group each having 1 to 8 carbon atoms; and n is an integral number from 1 to 3.

3. The coating liquid for forming a silica-based coating film with a low dielectric constant according to claim 1, wherein said tetraalkyl ortho silicate (TAOS) is tetraethyl ortho silicate (TEOS), tetramethyl ortho silicate (TMOS) or a mixture thereof.

4. The coating liquid for forming a silica-based coating film with a low dielectric constant according to claim 1, wherein said alkoxysilane (AS) is methyltrimethoxy silane (MTMS), methyltriethoxy silane (MTES) or a mixture thereof.

5. The coating liquid for forming a silica-based coating film with a low dielectric constant according to claim 1, wherein said tetraalkyl ammonium hydroxide (TAAOH) is tetrapropyl ammonium hydroxide (TPAOH), tetrabutyl ammonium hydroxide (TBAOH) or a mixture thereof.

6. The coating liquid for forming a silica-based coating film with a low dielectric constant according to claim 1, wherein a content of impurities comprising compounds of alkali metal elements including sodium (Na) and potassium (K) in said tetraalkyl ammonium hydroxide (TAAOH) is 50 ppb by weight or below on respective element bases.

7. The coating liquid for forming a silica-based coating film with a low dielectric constant according to claim 1, wherein a content of impurities comprising compounds of halogen group elements including bromine (Br) and chlorine (Cl) in said tetraalkyl ammonium hydroxide (TAAOH) is 1 ppm by weight or less on respective element bases.

8. The coating liquid for forming a silica-based coating film with a low dielectric constant according to claim 1, wherein the coating liquid contains a silicon compound as a hydrolysate of said tetraalkyl ortho silicate. (TAOS) and said alkoxysilane (AS) by 2 to 40% by weight.

9. The coating liquid for forming a silica-based coating film with a low dielectric constant according to claim 2, wherein said tetraalkyl ortho silicate (TAOS) is tetraethyl ortho silicate (TEOS), tetramethyl ortho silicate (TMOS) or a mixture thereof.

10. The coating liquid for forming a silica-based coating film with a low dielectric constant according to claim 2, wherein said alkoxysilane (AS) is methyltrimethoxy silane (MTMS), methyltriethoxy silane (MTES) or a mixture thereof.

11. The coating liquid for forming a silica-based coating film with a low dielectric constant according to claim 2, wherein said tetraalkyl ammonium hydroxide (TAAOH) is tetrapropyl ammonium hydroxide (TPAOH), tetrabutyl ammonium hydroxide (TBAOH) or a mixture thereof.

12. The coating liquid for forming a silica-based coating film with a low dielectric constant according to claim 2, wherein a content of impurities comprising compounds of alkali metal elements including sodium (Na) and potassium (K) in said tetraalkyl ammonium hydroxide (TAAOH) is 50 ppb by weight or below on respective element bases.

13. The coating liquid for forming a silica-based coating film with a low dielectric constant according to claim 2, wherein a content of impurities comprising compounds of halogen group elements including bromine (Br) and chlorine (Cl) in said tetraalkyl ammonium hydroxide (TAAOH) is 1 ppm by weight or less on respective element bases.

14. The coating liquid for forming a silica-based coating film with a low dielectric constant according to claim 2, wherein a molar ratio (TAOS/AS) of said tetraalkyl ortho silicate (TAOS) and said alkoxysilane (AS) is in a range from 6/4 to 2/8.

15. The coating liquid for forming a silica-based coating film with a low dielectric constant according to claim 14, wherein a molar ratio (TAAOH/(TAOS+AS)) of said tetraalkyl ammonium hydroxide (TAAOH), and the components for forming the silica-based coating film (TAOS+AS) is in a range from 1/10 to 7/10.

16. The coating liquid for forming a silica-based coating film with a low dielectric constant according to claim 2, wherein the coating liquid contains a silicon compound as a hydrolysate of said tetraalkyl ortho silicate (TAOS) and said alkoxysilane (AS) by 2 to 40% by weight.

17. The coating liquid for forming a silica-based coating film with a low dielectric constant according to claim 1, wherein said coating film has a surface roughness of 1 nm or below without forming a zeolitic coating.

18. The coating liquid for forming a silica-based coating film with a low dielectric constant according to claim 2, wherein said coating film has a surface roughness of 1 nm or below without forming a zeolitic coating.

* * * * *